United States Patent
Noh et al.

(10) Patent No.: US 12,342,624 B2
(45) Date of Patent: Jun. 24, 2025

(54) DISPLAY APPARATUS

(71) Applicant: LG Display Co., Ltd., Seoul (KR)

(72) Inventors: So-Young Noh, Goyang-si (KR); Ki-Tae Kim, Seoul (KR); Kyeong-Ju Moon, Paju-si (KR); Hyuk Ji, Paju-si (KR); Jin-Kyu Roh, Gimcheon-si (KR); Jung-Doo Jin, Gumi-si (KR); Kye-Chul Choi, Seoul (KR); Dong-Yup Kim, Gimpo-si (KR); Chan-Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/175,234

(22) Filed: Feb. 27, 2023

(65) Prior Publication Data

US 2023/0207570 A1 Jun. 29, 2023

Related U.S. Application Data

(63) Continuation of application No. 16/920,467, filed on Jul. 3, 2020, now Pat. No. 11,616,082.

(30) Foreign Application Priority Data

Jul. 4, 2019 (KR) .................. 10-2019-0080636
Dec. 31, 2019 (KR) .................. 10-2019-0180098

(51) Int. Cl.
*H10D 86/60* (2025.01)
*H10D 86/40* (2025.01)
*H10K 59/12* (2023.01)

(52) U.S. Cl.
CPC .......... *H10D 86/60* (2025.01); *H10D 86/423* (2025.01); *H10D 86/431* (2025.01); *H10K 59/12* (2023.02)

(58) Field of Classification Search
None
See application file for complete search history.

(56) References Cited

U.S. PATENT DOCUMENTS 9,093,540 B2 7/2015 Lee et al.
9,443,876 B2 9/2016 Yamazaki et al.
(Continued)

FOREIGN PATENT DOCUMENTS

CN 103456793 A 12/2013
CN 105280679 A 1/2016
(Continued)

OTHER PUBLICATIONS

Japan Patent Office, Notice of Reasons for Rejection, JP Patent Application No. 2020-115664, Aug. 17, 2021, eight pages.
(Continued)

*Primary Examiner* — Khaja Ahmad
(74) *Attorney, Agent, or Firm* — Fenwick & West LLP

(57) ABSTRACT

A display apparatus includes an oxide semiconductor pattern disposed on a device substrate and including a channel region disposed between a source region and a drain region, a gate electrode overlapping the channel region of the oxide semiconductor pattern and having a structure in which a first hydrogen barrier layer and a gate conductive layer are stacked, and a gate insulating film disposed between the oxide semiconductor pattern and the gate electrode to expose the source region and the drain region of the oxide semiconductor pattern. The gate electrode exposes a portion of the gate insulating film that is adjacent to the source region and a portion of the gate insulating film that is adjacent to the drain region.

14 Claims, 10 Drawing Sheets

(56) References Cited

U.S. PATENT DOCUMENTS

| | | | |
|---|---|---|---|
| 9,455,333 B2 | 9/2016 | Lee et al. | |
| 9,508,861 B2 | 11/2016 | Yamazaki et al. | |
| 9,530,830 B2 | 12/2016 | Ryu et al. | |
| 9,653,487 B2 | 5/2017 | Yamazaki et al. | |
| 9,728,556 B2 | 8/2017 | Yamazaki et al. | |
| 9,793,377 B2 | 10/2017 | Lee et al. | |
| 10,043,828 B2 | 8/2018 | Yamazaki et al. | |
| 10,083,990 B2 | 9/2018 | Oh et al. | |
| 10,192,944 B2 | 1/2019 | Lee et al. | |
| 10,256,256 B2 | 4/2019 | Park et al. | |
| 10,347,705 B2 | 7/2019 | Kim et al. | |
| 10,373,981 B2 | 8/2019 | Yamazaki et al. | |
| 10,431,599 B2 | 10/2019 | Lee et al. | |
| 10,475,819 B2 | 11/2019 | Yamazaki et al. | |
| 10,672,339 B2 | 6/2020 | Beak et al. | |
| 10,692,893 B2 | 6/2020 | Lee et al. | |
| RE48,290 E | 10/2020 | Lee et al. | |
| 10,818,694 B2 | 10/2020 | Yang et al. | |
| 10,937,813 B2 | 3/2021 | Matsukizono | |
| 2013/0320328 A1 | 12/2013 | Lee et al. | |
| 2014/0340608 A1 | 11/2014 | Yamazaki et al. | |
| 2015/0221678 A1 | 8/2015 | Yamazaki et al. | |
| 2015/0221679 A1 | 8/2015 | Yamazaki et al. | |
| 2015/0243718 A1* | 8/2015 | Kwon | H10K 59/131 257/43 |
| 2015/0333154 A1 | 11/2015 | Lee et al. | |
| 2015/0333184 A1 | 11/2015 | Lee et al. | |
| 2016/0005803 A1 | 1/2016 | Ryu et al. | |
| 2016/0064421 A1 | 3/2016 | Oh et al. | |
| 2016/0322510 A1* | 11/2016 | Yamazaki | H10K 50/80 |
| 2017/0040348 A1 | 2/2017 | Yamazaki et al. | |
| 2017/0162640 A1 | 6/2017 | Lee et al. | |
| 2017/0162716 A1 | 6/2017 | Koezuka | |
| 2017/0170252 A1 | 6/2017 | Kim et al. | |
| 2017/0179164 A1 | 6/2017 | Choi et al. | |
| 2017/0236846 A1* | 8/2017 | Yamazaki | H10D 62/80 257/43 |
| 2017/0309650 A1 | 10/2017 | Yamazaki et al. | |
| 2017/0338245 A1 | 11/2017 | Park et al. | |
| 2018/0166015 A1 | 6/2018 | Beak et al. | |
| 2018/0182832 A1 | 6/2018 | Lee et al. | |
| 2018/0323246 A1 | 11/2018 | Zhang et al. | |
| 2019/0006393 A1 | 1/2019 | Yamazaki et al. | |
| 2019/0081089 A1 | 3/2019 | Cho et al. | |
| 2019/0096919 A1 | 3/2019 | Matsukizono | |
| 2019/0123069 A1 | 4/2019 | Yang et al. | |
| 2019/0131322 A1 | 5/2019 | Ito et al. | |
| 2019/0157367 A1 | 5/2019 | Lee et al. | |
| 2019/0288048 A1* | 9/2019 | Kang | H10K 59/1216 |
| 2019/0386034 A1 | 12/2019 | Lee et al. | |
| 2020/0388708 A1 | 12/2020 | Koezuka et al. | |

FOREIGN PATENT DOCUMENTS

| | | |
|---|---|---|
| CN | 105390504 A | 3/2016 |
| CN | 107017287 A | 8/2017 |
| CN | 107818991 A | 3/2018 |
| CN | 108231830 A | 6/2018 |
| CN | 108257972 A | 7/2018 |
| CN | 109473456 A | 3/2019 |
| JP | 2018-139296 A | 9/2018 |
| JP | 2019-062141 A | 4/2019 |
| JP | 2019-075573 A | 5/2019 |
| JP | 2019-087552 A | 6/2019 |
| KR | 10-2015-0088103 A | 7/2015 |
| KR | 10-2017-0065069 A | 6/2017 |
| KR | 10-2017-0068656 A | 6/2017 |
| KR | 10-2017-0131787 A | 11/2017 |
| KR | 10-2019-0044043 A | 4/2019 |

OTHER PUBLICATIONS

United States Office Action, U.S. Appl. No. 16/920,467, filed Aug. 4, 2022, 12 pages.

China National Intellectual Property Administration, Office Action, Chinese Patent Application No. 202010617571.5, Sep. 11, 2023, eight pages.

China National Intellectual Property Administration, Office Action, Chinese Patent Application No. 202010617571.5, Jul. 9, 2024, six pages.

Korean Intellectual Property Office, Office Action, Korean Patent Application No. 10-2019-0180098, Mar. 4, 2025, 20 pages.

* cited by examiner

DISPLAY APPARATUS

CROSS-REFERENCE TO RELATED APPLICATIONS

This application is a continuation application of U.S. patent application Ser. No. 16/920,467, filed on Jul. 3, 2020, which claims the benefit of Republic of Korea Patent Application No. 10-2019-0080636 filed on Jul. 4, 2019, and Republic of Korea Patent Application No. 10-2019-0180098 filed on Dec. 31, 2019, all of which are hereby incorporated by reference as if fully set forth herein.

BACKGROUND

Field

The present disclosure relates to a display apparatus in which a thin-film transistor includes an oxide semiconductor pattern.

Discussion of the Related Art

In general, an electronic appliance such as a monitor, a TV, a laptop computer, and a digital camera includes a display apparatus to realize an image. For example, the display apparatus may include a liquid crystal display apparatus including a liquid crystal and an electroluminescent display apparatus including an emission layer.

The display apparatus may include a plurality of pixels. Each of the pixels may emit a specific color of light. A driving circuit for generating a driving current according to a gate signal and a data signal may be disposed in each pixel. For example, the driving circuit may include at least one thin-film transistor.

The thin-film transistor may include a semiconductor pattern, a gate insulating film, a gate electrode, a source electrode, and a drain electrode. The semiconductor pattern may include a channel region disposed between a source region and a drain region. The gate insulating film and the gate electrode may be sequentially stacked on the channel region of the semiconductor pattern. For example, the gate insulating film may be formed by an etching process using the gate electrode as a mask.

The semiconductor pattern may include an oxide semiconductor. For example, the source region and the drain region of the semiconductor pattern, which are exposed by the gate insulating film and the gate electrode, may be regions that are conductorized by a process of forming the gate insulating film. However, in the display apparatus, a part of the oxide semiconductor constituting the semiconductor pattern may be deposited on a side surface of the gate insulating film in the process of forming the gate insulating film. The oxide semiconductor deposited on the side surface of the gate insulating film may cause an electrical short between the semiconductor pattern and the gate electrode. That is, in the display apparatus, the characteristics of the thin-film transistor may be deteriorated in the process of forming the gate insulating film.

SUMMARY

Accordingly, the present disclosure is directed to a display apparatus that substantially obviates one or more problems due to limitations and disadvantages of the related art.

An object of the present disclosure is to provide a display apparatus for preventing deterioration in the characteristics of a thin-film transistor due to the process of forming a gate insulating film.

Another object of the present disclosure is to provide a display apparatus for preventing the occurrence of an electrical short between an oxide semiconductor pattern and a gate electrode due to the process of forming a gate insulating film.

However, the objects to be accomplished by the present disclosure are not limited to the above-mentioned objects, and other objects not mentioned will be clearly understood by those skilled in the art from the following description.

A display apparatus according to an exemplary embodiment of the present disclosure may include an oxide semiconductor pattern disposed on a device substrate, a gate electrode overlapping the channel region of the oxide semiconductor pattern, and a gate insulating film disposed between the oxide semiconductor pattern and the gate electrode. The oxide semiconductor pattern may include a channel region between a source region and a drain region. The gate electrode may have a stacked structure of a first hydrogen barrier layer and a gate conductive layer. The gate insulating film may expose the source region and the drain region of the oxide semiconductor pattern. The gate electrode may expose a portion of the gate insulating film that is adjacent to the source region and a portion of the gate insulating film that is adjacent to the drain region.

A display apparatus according to an exemplary embodiment of the present disclosure may include an oxide semiconductor pattern disposed on a device substrate and including a source region, a channel region, and a drain region disposed side by side in a first direction, a gate insulating film disposed on the channel region of the oxide semiconductor pattern, and a gate electrode disposed on the gate insulating film and extending in a second direction perpendicular to the first direction. The gate electrode may have a stacked structure of a hydrogen barrier layer and a gate conductive layer. The length of the gate electrode in the first direction may be shorter than the length of the gate insulating film in the first direction.

A display apparatus according to an exemplary embodiment of the present disclosure may include a first thin-film transistor comprising a first semiconductor pattern comprising poly-silicon, a first gate electrode overlapping the first semiconductor pattern, with a first gate insulating film interposed therebetween, and first source and drain electrodes connected to the first semiconductor pattern, and a second thin-film transistor comprising a second semiconductor pattern comprising an oxide semiconductor, a second gate electrode overlapping the second semiconductor pattern, with a second gate insulating film interposed therebetween, and second source and drain electrodes connected to the second semiconductor pattern, wherein the second gate electrode includes a gate conductive layer disposed on the second gate insulating film; and a hydrogen barrier layer disposed between the gate conductive layer and the second gate insulating film, and wherein opposite side surfaces of the hydrogen barrier layer are positioned further inwards than opposite side surfaces of the second gate insulating film.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure.

DETAILED DESCRIPTION

Figure 1:
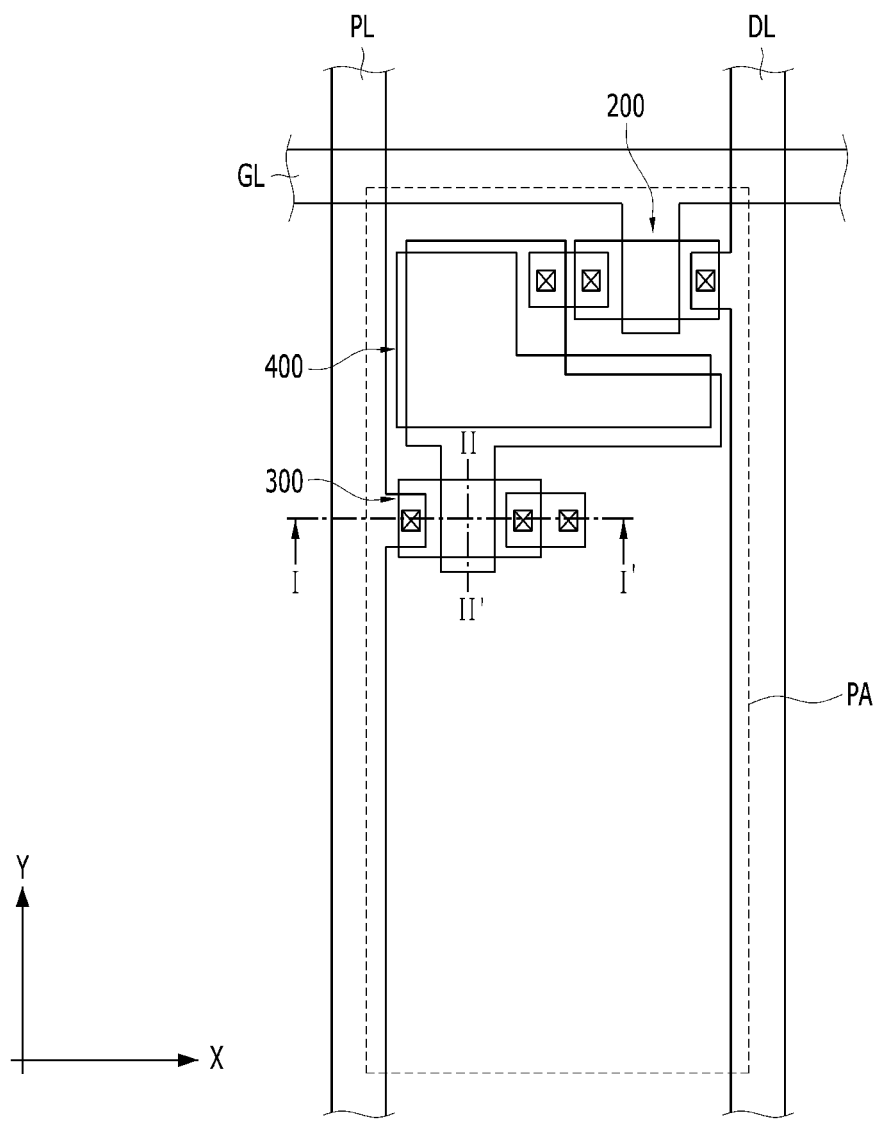
FIG. 1 is a view illustrating a display apparatus according to an exemplary embodiment of the present disclosure.

The details of the above objects, technical configurations, and effects of the present disclosure will be clearly understood from the following detailed description taken in conjunction with the accompanying drawings showing embodiments of the present disclosure. Although exemplary embodiments of the present disclosure will be described, it will be apparent that the technical spirit of the present disclosure can be practiced by those skilled in the art without being restricted or limited to the embodiments.

Further, throughout the specification, the same reference numerals represent the same components, and in the drawings, the length and thickness of layers or areas may be exaggerated for the sake of convenience. In addition, when a first element is referred to as being "on" a second element, it can be directly on the second element or be indirectly on the second element with a third element interposed therebetween.

It will be understood that the terms "first" and "second" are used herein to describe various elements and are only used to distinguish one element from another element. Thus, a first element may be termed a second element, and similarly, a second element may be termed a first element without departing from the teachings of the present disclosure.

Terms used in the following description are used only to describe the specific embodiments and are not intended to restrict the present disclosure. The expression of singularity includes a plural meaning unless the singularity expression is explicitly different in context. In the specification, the terms "comprising," "including," and "having" shall be understood to designate the presence of particular features, numbers, steps, operations, elements, parts, or combinations thereof but not to preclude the presence or addition of one or more other features, numbers, steps, operations, elements, parts, or combinations thereof.

Unless otherwise defined, all terms used herein, which include technical or scientific terms, have the same meanings as those generally appreciated by those skilled in the art. The terms, such as ones defined in common dictionaries, should be interpreted as having the same meanings as terms in the context of pertinent technology, and should not be interpreted as having ideal or excessively formal meanings unless clearly defined in the specification.

Figure 2:
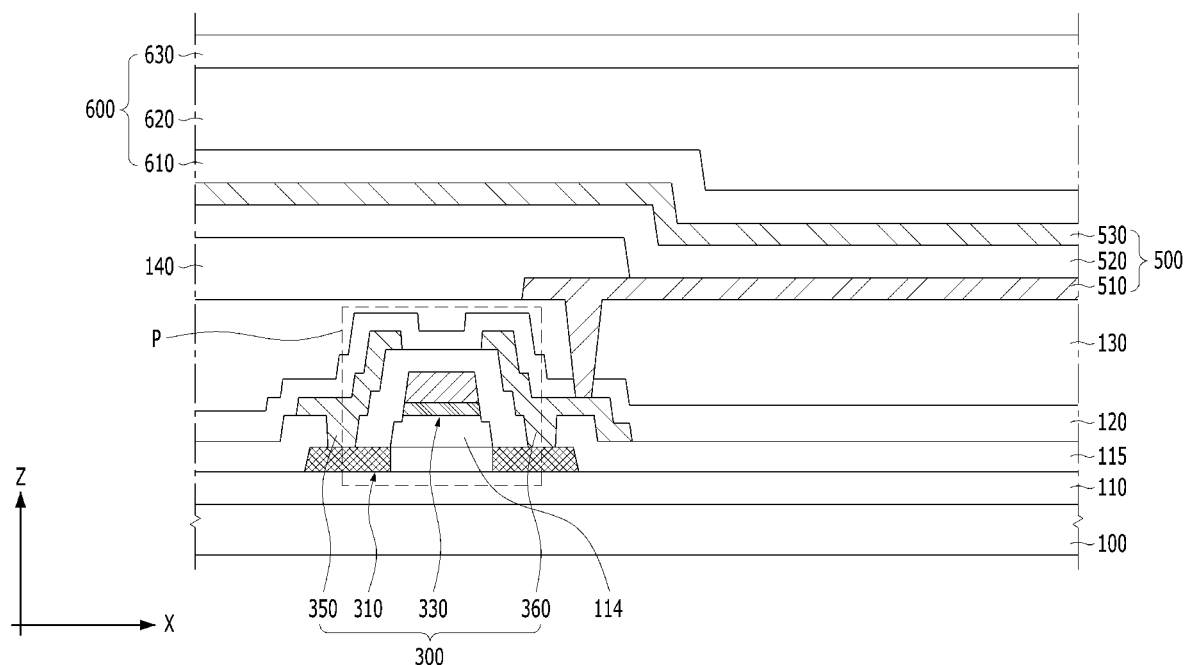
FIG. 2 is a cross-sectional view taken along line I-I' in FIG. 1, according to an exemplary embodiment of the present disclosure.
Figure 3:
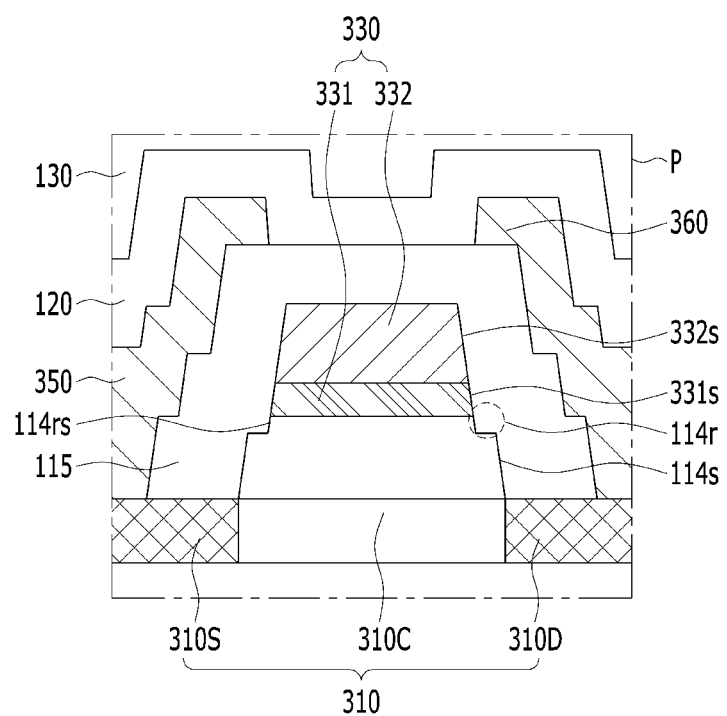
FIG. 3 is an enlarged view of region P in FIG. 2, according to an exemplary embodiment of the present disclosure.

FIG. 1 is a view schematically illustrating a display apparatus according to an exemplary embodiment of the present disclosure. FIG. 2 is a view illustrating a cross-section taken along line I-I' in FIG. 1, according to an embodiment of the present disclosure. FIG. 3 is an enlarged view of region P in FIG. 2, according to an embodiment of the present disclosure.

Referring to FIGS. 1 to 3, the display apparatus according to the exemplary embodiment of the present disclosure may include a substrate (device substrate) 100. The substrate 100 may include an insulating material. For example, the substrate 100 may include glass or plastic.

A plurality of pixels PA and signal lines GL, DL, and PL for transmitting signals to each pixel PA may be disposed on the substrate 100. For example, the signal lines GL, DL, and PL may include a gate line GL for applying a gate signal, a data line DL for applying a data signal, and a power voltage supply line PL for supplying a power voltage.

The signal lines GL, DL, and PL may constitute each pixel PA. For example, each of the pixels PA may be surrounded by the corresponding signal lines GL, DL, and PL. However, the disclosure is not limited thereto. For example, each of the pixels PA may be defined by an opening region in a bank insulating film 140.

Each of the pixels PA may emit light having a luminance corresponding to signals supplied through the corresponding signal lines GL, DL, and PL. For example, a driving circuit connected to the corresponding signal lines GL, DL, and PL may be disposed in each pixel PA.

Each of the driving circuits may include at least two thin-film transistors 200 and 300. For example, each of the driving circuits may include a first thin-film transistor 200, a second thin-film transistor 300, and a storage capacitor 400. The first thin-film transistor 200 may turn on or off the second thin-film transistor 300 according to a gate signal. The storage capacitor 400 may maintain the signal applied to the second thin-film transistor 300 from the first thin-film transistor 200 for a predetermined period of time. The second thin-film transistor 300 may generate a driving current corresponding to the signal of the first thin-film transistor 200. For example, the second thin-film transistor 300 may include a second semiconductor pattern 310, a second gate electrode 330 overlapping the second semiconductor pattern 310, a second source electrode 350 and a second drain electrode 360. A second gate insulating film 114 may be interposed between the second semiconductor pattern 310 and the second gate electrode 330. The second source and drain electrodes 350 and 360 may be in contact with a portion of the second semiconductor pattern 310 exposed by a contact hole of a second interlayer insulating film 115, respectively.

The second semiconductor pattern 310 may be disposed on the substrate 100. The second semiconductor pattern 310 may be an oxide semiconductor pattern including an oxide semiconductor. For example, the second semiconductor pattern 310 may include metal oxide such as Indium-Gallium-Zinc Oxide (IGZO).

The second semiconductor pattern 310 may include a second source region 310S, a second channel region 310C, and a second drain region 310D, which are disposed side by side (e.g, parallel to each other) in a first direction X. For example, the second semiconductor pattern 310 may have the shape of a bar that extends in the first direction X. The second channel region 310C may be disposed between the second source region 310S and the second drain region 310D. The resistance of the second source region 310S and the resistance of the second drain region 310D may be lower than that of the second channel region 310C. For example, the second source region 310S and the second drain region 310D may be conductorized regions. The second channel region 310C may be a non-conductorized region.

The second gate insulating film 114 may be disposed on the second channel region 310C of the second semiconductor pattern 310. The second gate insulating film 114 may include an insulating material. For example, the second gate insulating film 114 may include a silicon oxide (SiOx)-based material and/or a silicon nitride (SiNx)-based material. The silicon oxide (SiOx)-based material may include silicon dioxide (SiO₂). The second gate insulating film 114 may have a high dielectric constant. For example, the second gate insulating film 114 may include a high-K material having a high dielectric constant. The high-K material may include a hafnium oxide (HfOx)-based material or a titanium oxide (TiOx)-based material. For example, the hafnium oxide (HfOx)-based material may include hafnium dioxide (HfO₂). The titanium oxide (TiOx)-based material layer may be formed on the top surface of the second gate insulating film 114, which faces a first hydrogen barrier layer 331. The second gate insulating film 114 may have a multi-layered structure.

The second gate insulating film 114 may expose the second source region 310S and the second drain region 310D of the second semiconductor pattern 310. The second source region 310S and the second drain region 310D of the second semiconductor pattern 310 may not overlap the second gate insulating film 114. For example, a process of forming the second gate insulating film 114 may include a process of forming a gate insulating material layer on the device substrate 100 in which the second semiconductor pattern 310 is formed, and a process of removing a portion of the gate insulating material layer that covers the second source region 310S and the second drain region 310D of the second semiconductor pattern 310. The second source region 310S and the second drain region 310D of the second semiconductor pattern 310 may be conductorized by an etchant used in the process of removing the gate insulating material layer. A length of the second gate electrode 330 in the first direction X may be shorter than a length of the second gate insulating film 114 in the first direction X. A length of the second gate electrode 330 in the second direction Y may be longer than a length of the second gate insulating film 114 in the second direction Y.

Both side surfaces of the first hydrogen barrier layer 331 may be disposed inside both side surfaces of the second gate insulating film 114. That is, opposite side surfaces of the first hydrogen barrier layer 331 are positioned further inwards than opposite side surfaces of the second gate insulating film 114.

The second gate insulating film 114 may have protruding portions. The protruding portions of the second gate insulating film 114 may protrude from both ends of the second gate electrode 330. The protruding portions of the second gate insulating film 114 may not overlap the second gate electrode 330. As illustrated in FIG. 3, the second gate insulating film 114 may extend so as not to overlap the first hydrogen barrier layer 331 of the second gate electrode 330. The second gate insulating film 114 may have protruding portions that protrude from the both ends of the first hydrogen barrier layer 331 of the second gate electrode 330. For example, the side surface 114s of the second gate insulating film 114 may be disposed outside the side surface 331s of the first hydrogen barrier layer 331. The second gate insulating film 114 may have protruding portions that protrude from the side surface 331s of the first hydrogen barrier layer 331. The protruding portions of the second gate insulating film 114 may not overlap the first hydrogen barrier layer 331. The second gate insulating film 114 may include stepped portions 114r. The stepped portions 114r may be disposed on a top surface of the second gate insulating film 114. For example, the stepped portions 114r may be disposed at the protruding portions of the second gate insulating film 114. The stepped portions 114r may be disposed at the edge of the second gate insulating film 114. For example, the stepped portions 114r may be disposed in a region adjacent to the second source region 310S of the second semiconductor pattern 310 and in a region adjacent to the second drain region 310D of the second semiconductor pattern 310.

Each stepped portion 114r may be a region in which a corresponding region of the second gate insulating film 114 is recessed. For example, each stepped portion 114r of the second gate insulating film 114 may have a relatively small thickness.

Each stepped portion 114r may be disposed on a region in which the second gate insulating film 114 does not overlap the second gate electrode 330. Thus, a region of the second gate insulating film 114 overlapping the second gate electrode 330 may have a thickness greater than a region of the second gate insulating film 114 that does not overlap the second gate electrode 330.

The second gate electrode 330 may be disposed on the second gate insulating film 114. The second gate electrode 330 may be disposed on the second channel region 310C of the second semiconductor pattern 310. For example, the second gate electrode 330 may be insulated from the second semiconductor pattern 310 by the second gate insulating film 114. The second gate electrode 330 may overlap the second channel region 310c of the second semiconductor pattern 310, with the second gate insulating film 114 interposed therebetween. The second gate electrode 330 may have a multi-layer structure. For example, the second gate electrode 330 may have a stacked structure of the first hydrogen barrier layer 331 and a gate conductive layer 332.

The first hydrogen barrier layer 331 may prevent hydrogen generated by components formed by a subsequent process from permeating the second channel region 310C of the second semiconductor pattern 310. For example, the first hydrogen barrier layer 331 may include a hydrogen storage material or a hydrogen-blocking material. The first hydrogen barrier layer 331 may include a conductive material. For example, the first hydrogen barrier layer 331 may be a metal material capable of being stably combined with hydrogen (H). For example, the first hydrogen barrier layer 331 may be a metal material such as titanium (Ti), calcium (Ca), yttrium (Y), magnesium (Mg), tantalum (Ta), or vanadium (V). Alternatively, the first hydrogen barrier layer 331 may be an alloy including titanium (Ti).

The first hydrogen barrier layer 331 may be disposed between the second gate insulating film 114 and the gate conductive layer 332. For example, the first hydrogen barrier layer 331 may be in direct contact with the top surface of the second gate insulating film 114. Thus, in the display apparatus according to the exemplary embodiment of the present disclosure, the area of the second semiconductor pattern 310 that is shielded by the first hydrogen barrier layer 331 may be increased or maximized. And, in the display apparatus according to the exemplary embodiment of the present disclosure, the first hydrogen barrier layer 331 may prevent hydrogen from permeating the second channel region 310C of the second semiconductor pattern 310 through the second source region 310S and the second drain region 310D of the second semiconductor pattern 310. Therefore, in the display apparatus according to the exemplary embodiment of the present disclosure, it is possible to effectively prevent the characteristics of the second channel region 310C of the second semiconductor pattern 310 from being changed by the permeation of hydrogen.

A bottom surface of the first hydrogen barrier layer 331 may have a smaller width than a bottom surface of the second gate insulating film 114 in the first direction X. The side surface 331s of the first hydrogen barrier layer 331 may be disposed inside the side surface 114s of the second gate insulating film 114. For example, the side surface 331s of the first hydrogen barrier layer 331 may be vertically aligned with a sidewall 114rs of each stepped portion 114r. The sidewall 114rs of each stepped portion 114r may be continuous with the side surface 331s of the first hydrogen barrier layer 331. That is, in the display apparatus according to the exemplary embodiment of the present disclosure, the first hydrogen barrier layer 331 may be spaced apart from the side surface 114s of the second gate insulating film 114. Thus, in the display apparatus according to the exemplary embodiment of the present disclosure, the oxide semiconductor deposited on the side surface 114s of the second gate insulating film 114 in the process of forming the second gate insulating film 114 may not contact the first hydrogen barrier layer 331. Therefore, in the display apparatus according to the exemplary embodiment of the present disclosure, it is possible to prevent the occurrence of an electrical short between the second semiconductor pattern 310 and the second gate electrode 330 through the oxide semiconductor deposited on the side surface 114s of the second gate insulating film 114. For example, a wet etching process may be performed to form the second gate electrode 330 disposed on the second gate insulating film 114. During the wet etching process for forming the second gate electrode 330, the material of the second semiconductor pattern 310 may be deposited on the side surface 114s of the second gate insulating film 114 by an etchant. For example, the second semiconductor pattern 310 may be an oxide semiconductor pattern. Indium (In) included in the oxide semiconductor pattern may be deposited on the side surface 114s of the second gate insulating film 114, so that a residual film may be formed. An electrical short may occur between the second semiconductor pattern 310 and the second gate electrode 330 due to the residual film formed of indium (In) which is deposited on the side surface 114s of the second gate insulating film 114. However, in the display apparatus according to the exemplary embodiment of the present disclosure, a portion of the residual film formed of indium (In) which is deposited on the side surface 114s of the second gate insulating film 114 may be removed by forming the stepped portion 114r on each of both sides of the second gate insulating film 114. Therefore, the occurrence of an electrical short between the second semiconductor pattern 310 and the second gate electrode 330 due to the residual film formed by indium (In) film may be prevented.

The gate conductive layer 332 may be disposed on the first hydrogen barrier layer 331. For example, the first hydrogen barrier layer 331 may be disposed between the second gate insulating film 114 and the gate conductive layer 332. The gate conductive layer 332 may include a conductive material. The resistance of the gate conductive layer 332 may be lower than that of the first hydrogen barrier layer 331. For example, the gate conductive layer 332 may include a metal, such as molybdenum (Mo), aluminum (Al), chromium (Cr), tungsten (W), and copper (Cu). The thickness of the gate conductive layer 332 may be greater than the thickness of the first hydrogen barrier layer 331. Thus, in the display apparatus according to the exemplary embodiment of the present disclosure, signal delay due to the first hydrogen barrier layer 331 may be reduced or minimized. The metal of the gate conductive layer 332, such as molybdenum (Mo), aluminum (Al), chromium (Cr), tungsten (W), and copper (Cu), may be unstably combined with hydrogen (H), compared with the first hydrogen barrier layer 331. During the deposition process for forming the second interlayer insulating film 115 on the gate conductive layer 332, hydrogen (H) in the chamber may be unstably combined with the metal material of the gate conductive layer 332. The unstable combination between the metal material of the gate conductive layer 332 and hydrogen (H) may be released in a heat treatment process, which is a subsequent process. When the combination between the metal of the gate conductive layer 332 and hydrogen (H) is released, the hydrogen (H) discharged from the gate conductive layer 332 may permeate the second semiconductor pattern 310 of the second thin-film transistor 300. The hydrogen (H) introduced into the second semiconductor pattern 310 may be subjected to rehydrogenation in the second semiconductor pattern 310, which may cause deterioration in the characteristics of the second thin-film transistor 300.

Therefore, the first hydrogen barrier layer 331 between the bottom surface of the gate conductive layer 332 and the top surface of the second gate insulating film 114, may be combined with the hydrogen (H) discharged from the gate conductive layer 332. Thereby, the first hydrogen barrier layer 331, which is made of a metal material capable of being stably combined with hydrogen (H), may prevent the hydrogen (H) from permeating the second channel region 310C of the second semiconductor pattern 310 by being stably combined with the hydrogen (H) generated in the manufacturing process. In addition, the deterioration in the characteristics of the second thin-film transistor 300 may be prevented by preventing rehydrogenation of the second channel region 310C.

The gate conductive layer 332 may be formed together with the first hydrogen barrier layer 331. For example, the side surface 332s of the gate conductive layer 332 may be vertically aligned with the side surface 331s of the first hydrogen barrier layer 331. The side surface 331s of the first hydrogen barrier layer 331 may be continuous with the side surface 332s of the gate conductive layer 332. Therefore, the width of the top surface of the first hydrogen barrier layer 331 and the width of the bottom surface of the gate conductive layer 332 may be the same.

The second interlayer insulating film 115 may be disposed on the second semiconductor pattern 310 and the second gate electrode 330. For example, the side surface 114s of the second gate insulating film 114 and the side surface (331s and 332s) of the second gate electrode 330 may be covered by the second interlayer insulating film 115. The second interlayer insulating film 115 may include an insulating material. For example, the second interlayer insulating film 115 may be formed in a single-layered structure including a silicon oxide (SiOx)-based material or a silicon nitride (SiNx)-based material, or may be formed in a multi-layered structure including a silicon oxide (SiOx)-based material and a silicon nitride (SiNx)-based material.

The second source electrode 350 may be disposed on the second interlayer insulating film 115. The second source electrode 350 may be electrically connected to the second source region 310S of the second semiconductor pattern 310. For example, the second interlayer insulating film 115 may include a source contact hole that exposes a portion of the second source region 310S of the second semiconductor pattern 310. The second source electrode 350 may include a region that overlaps the second source region 310S of the second semiconductor pattern 310.

The second source electrode 350 may include a conductive material. For example, the second source electrode 350 may include a metal, such as aluminum (Al), chromium (Cr), molybdenum (Mo), tungsten (W), and copper (Cu).

The second drain electrode 360 may be disposed on the second interlayer insulating film 115. The second drain electrode 360 may be electrically connected to the second drain region 310D of the second semiconductor pattern 310. For example, the second interlayer insulating film 115 may include a drain contact hole that exposes a portion of the second drain region 310D of the second semiconductor pattern 310. The second drain electrode 360 may include a region that overlaps the second drain region 310D of the second semiconductor pattern 310.

The second drain electrode 360 may include a conductive material. For example, the second drain electrode 360 may include a metal, such as aluminum (Al), chromium (Cr), molybdenum (Mo), tungsten (W), and copper (Cu). The second drain electrode 360 may include the same material as the second source electrode 350. For example, the second drain electrode 360 may be formed by the same process as the second source electrode 350.

The first thin-film transistor 200 may have the same structure as the second thin-film transistor 300. For example, the first thin-film transistor 200 may include a first oxide semiconductor pattern. A first gate electrode of the first thin-film transistor 200 may include a side surface that is located further inwards than a first gate insulating film of the first thin-film transistor 200. The first oxide semiconductor pattern, the first gate insulating film, and the first gate electrode of the first thin-film transistor 200 may be formed through the same process as the second semiconductor pattern 310, the second gate insulating film 114, and the second gate electrode 330 of the second thin-film transistor 300. Thus, in the display apparatus according to the exemplary embodiment of the present disclosure, it is possible to prevent deterioration in the characteristics of the first thin-film transistor 200 and deterioration in the characteristics of the second thin-film transistor 300 due to the process of forming the first gate insulating film and the second gate insulating film 114. Therefore, in the display apparatus according to the exemplary embodiment of the present disclosure, the reliability of the driving circuit may be improved.

The first thin-film transistor 200 may be connected to the corresponding gate line GL and to the corresponding data line DL. For example, the first gate electrode of the first thin-film transistor 200 may be connected to the corresponding gate line GL, and a first source electrode of the first thin-film transistor 200 may be connected to the corresponding data line DL. A first drain electrode of the first thin-film transistor 200 may be electrically connected to the second gate electrode 330 of the second thin-film transistor 300.

A first buffer layer 110 may be disposed between the substrate 100 and each driving circuit. For example, the first buffer layer 110 may be located between the substrate 100 and the second semiconductor pattern 310 of the second thin-film transistor 300. The first buffer layer 110 may extend along the surface of the substrate 100. For example, the first buffer layer 110 located between the substrate 100 and the second thin-film transistor 300 may be in contact with the first buffer layer 110 located between the substrate 100 and the first thin-film transistor 200. The first buffer layer 110 may prevent the substrate 100 from pollution during the process of forming the driving circuits. The first buffer layer 110 may include an insulating material. For example, the first buffer layer 110 may include a silicon oxide (SiOx)-based material and/or a silicon nitride (SiNx)-based material. The first buffer layer 110 may have a multi-layer structure.

A lower protective film 120 may be disposed on the driving circuits. The lower protective film 120 may prevent damage of the driving circuits due to external impact or moisture. For example, the second thin-film transistor 300 may be completely covered by the lower protective film 120. The lower protective film 120 may include an insulating material. For example, the lower protective film 120 may include a silicon nitride (SiNx)-based material or a silicon oxide (SiOx)-based material.

An over-coat layer 130 may be disposed on the lower protective film 120. The over-coat layer 130 may remove a thickness difference due to the driving circuits. For example, a top surface of the over-coat layer 130 opposite to the substrate 100 may be a flat surface. The over-coat layer 130 may extend along the lower protective film 120. The second thin-film transistor 300 may be covered by the over-coat layer 130.

The over-coat layer 130 may include an insulating material. The over-coat layer 130 may include a different material from the lower protective film 120. The over-coat layer 130 may include a material having relatively high fluidity. For example, the over-coat layer 130 may include an organic insulating material.

A light-emitting device 500 may be disposed on the over-coat layer 130 of each pixel PA. The light-emitting device 500 may emit light displaying a specific color. For example, the light-emitting device 500 may include a first electrode 510, a light-emitting layer 520, and a second electrode 530, which are sequentially stacked.

The first electrode 510 may include a conductive material. The first electrode 510 may include a metal having a relatively high reflectance. The first electrode 510 may have a multi-layer structure. For example, the first electrode 510 may have a structure in which a reflective electrode, formed of a metal such as aluminum (Al) or silver (Ag), is disposed between transparent electrodes formed of a transparent conductive material such as ITO or IZO.

The first electrode 510 may be electrically connected to the driving circuit of the corresponding pixel PA. For example, the lower protective film 120 and the over-coat layer 130 may include pixel contact holes partially exposing the second drain electrode 360 of the second thin-film transistor 300 in each pixel PA. The first electrode 510 may include a region that is in contact with the portion of the second drain electrode 360 of the second thin-film transistor 300 that is exposed by the corresponding pixel contact hole. Thus, in the display apparatus according to the exemplary embodiment of the present disclosure, the driving current generated by the second thin-film transistor 300 of each pixel PA may be supplied to the light-emitting device 500 of the corresponding pixel PA. Therefore, in the display apparatus according to the exemplary embodiment of the present disclosure, the light-emitting device 500 of each pixel PA may be controlled by the driving circuit of the corresponding pixel PA.

The light-emitting layer 520 may generate light having luminance corresponding to the voltage difference between the first electrode 510 and the second electrode 530. For example, the light-emitting layer 520 may include an emission material layer (EML) including an emission material. The emission material may include an organic material, an inorganic material, or a hybrid material. For example, the display apparatus according to the exemplary embodiment of the present disclosure may be an organic light-emitting display apparatus including the light-emitting layer 520 formed of an organic material.

The light-emitting layer 520 may have a multi-layer structure in order to increase luminous efficiency. For example, the light-emitting layer 520 may further include at least one of a hole injection layer (HIL), a hole transporting layer (HTL), an electron transporting layer (ETL), and an electron injection layer (EIL).

The second electrode 530 may include a conductive material. The second electrode 530 may include a different material from the first electrode 510. For example, the second electrode 530 may be a transparent electrode formed of a transparent conductive material such as ITO or IZO. Thus, in the display apparatus according to the exemplary embodiment of the present disclosure, the light generated by the light-emitting layer 520 of each pixel PA may emit outside through the second electrode 530.

The light-emitting device 500 of each pixel PA may operate independently. For example, a bank insulating film 140 may be disposed on the over-coat layer 130 so as to cover the edge of the first electrode 510 that is located in each pixel PA. The light-emitting layer 520 and the second electrode 530 of each light-emitting device 500 may be stacked on a portion of the corresponding first electrode 510 that is exposed by an opening region of the bank insulating film 140. The light-emitting layer 520 and the second electrode 530 located in each pixel PA may extend onto the bank insulating film 140. For example, the light-emitting layer 520 and the second electrode 530 of each pixel PA may be connected to the light-emitting layer 520 and the second electrode 530 of an adjacent pixel PA, respectively.

The bank insulating film 140 may include an insulating material. For example, the bank insulating film 140 may include an organic insulating material. The bank insulating film 140 may include a different material from the over-coat layer 130.

An encapsulating element (encapsulating member) 600 may be disposed on the light-emitting device 500 of each pixel PA. The encapsulating element 600 may prevent the damage of the light-emitting devices 500 due to external impact or moisture. The encapsulating element 600 may have a multi-layer structure. For example, the encapsulating element 600 may include a first encapsulating layer 610, a second encapsulating layer 620, and a third encapsulating layer 630, which are sequentially stacked.

Each of the first encapsulating layer 610, the second encapsulating layer 620, and the third encapsulating layer 630 may include an insulating material. The second encapsulating layer 620 may include a different material from the first encapsulating layer 610 and the third encapsulating layer 630. For example, the first encapsulating layer 610 and the third encapsulating layer 630 may be an inorganic insulating film formed of an inorganic insulating material, and the second encapsulating layer 620 may be an organic insulating film formed of an organic insulating material. Thus, in the display apparatus according to the exemplary embodiment of the present disclosure, a thickness difference due to the light-emitting device 500 of each pixel PA may be removed by the second encapsulating layer 620. For example, in the display apparatus according to the exemplary embodiment of the present disclosure, the surface of the encapsulating element 600 opposite to the device substrate 100 may be a flat surface.

Accordingly, the display apparatus according to the exemplary embodiment of the present disclosure may include the plurality of the pixels PA, in which the driving circuit composed of the thin-film transistors 200 and 300 including the second semiconductor pattern 310 is disposed. The second gate insulating film 114 located on the second channel region 310C of the second semiconductor pattern 310 may expose the second source region 310S and the second drain region 310D of the second semiconductor pattern 310. The second gate electrode 330 disposed on the second gate insulating film 114 may expose a portion of the second gate insulating film 114 that is adjacent to the second source region 310S of the second semiconductor pattern 310 and a portion of the second gate insulating film 114 that is adjacent to the second drain region 310D of the second semiconductor pattern 310. Therefore, the top surfaces of both side portions of the second gate insulating film 114 may not overlap the second gate electrode 330. A portion of the top surface of each side portion of the second gate insulating film 114, which is exposed by the second gate electrode 330, may be removed to form the stepped portion 114r. The stepped portion 114r of the second gate insulating film 114 may not overlap the second gate electrode 330. Thus, in the display apparatus according to the exemplary embodiment of the present disclosure, the occurrence of an electrical short between the second semiconductor pattern 310 and the second gate electrode 330 may be prevented by the stepped portion 114r of the second gate insulating film 114. Thereby, in the display apparatus according to the exemplary embodiment of the present disclosure, the reliability of the driving circuit located in each pixel PA may be improved.

Figure 4:
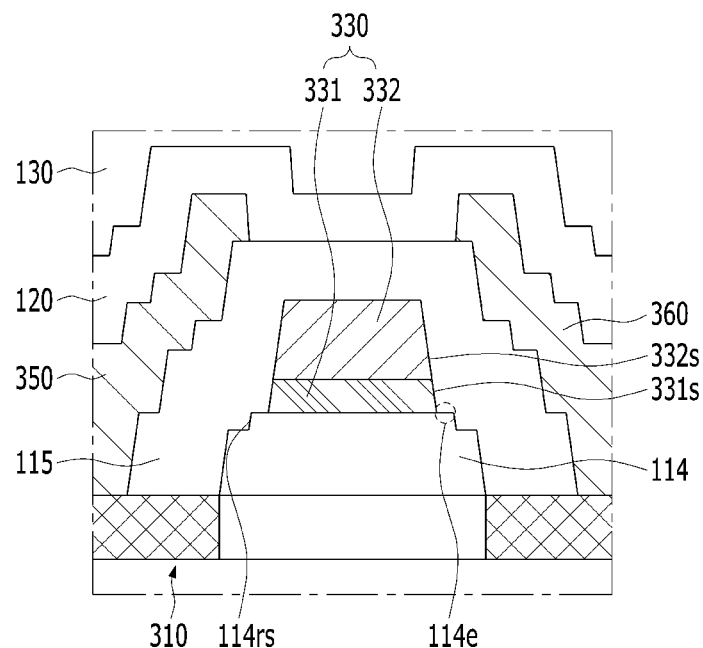
FIGS. 4 to 15 are views respectively illustrating a display apparatus according to another embodiments of the present disclosure.

The display apparatus according to the exemplary embodiment of the present disclosure is described that the first hydrogen barrier layer 331 of the second gate electrode 330 has a side surface 331s that is vertically aligned with the sidewall 114rs of each stepped portion 114r formed at the second gate insulating film 114. However, as illustrated in FIG. 4, in a display apparatus according to another exemplary embodiment of the present disclosure, the side surface 331s of the first hydrogen barrier layer 331 may be located further inwards than the sidewall 114rs of each stepped portion. For example, in the display apparatus according to another exemplary embodiment of the present disclosure, the top surface of the second gate insulating film 114, which faces the second gate electrode 330, may include a region 114e that is located between the sidewall 114rs of each stepped portion 114r and the side surface 331s of the first hydrogen barrier layer 331. Thus, in the display apparatus according to another exemplary embodiment of the present disclosure, it is possible to prevent the occurrence of an electrical short between the second gate electrode 330 and the second semiconductor pattern 310, which may be caused by unintended deposition of an oxide semiconductor on the side surface of the second gate insulating film 114. Therefore, in the display apparatus according to another exemplary embodiment of the present disclosure, the reliability of the driving circuit may be effectively improved.

Figure 5:
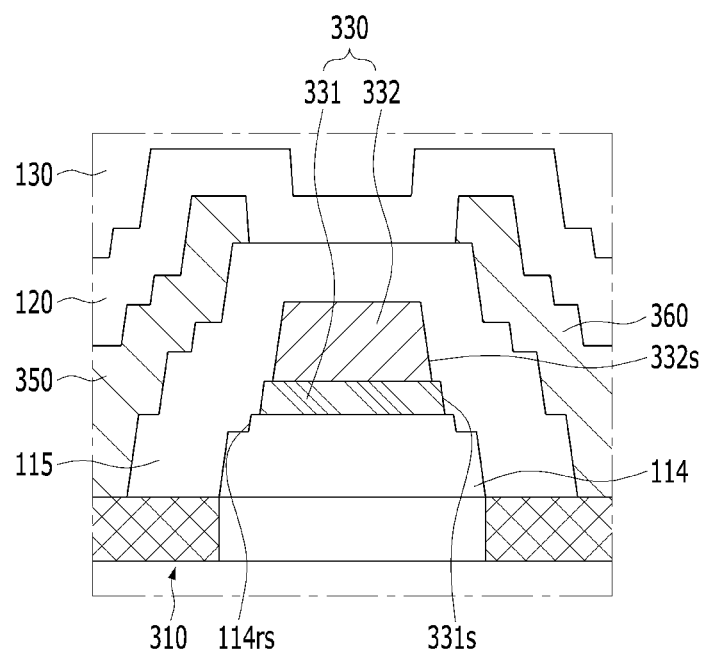
Figure 6:
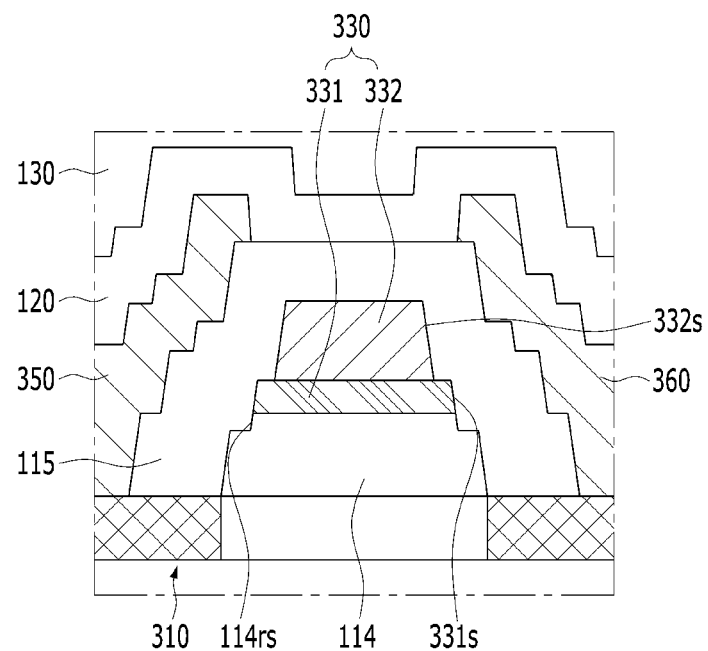

The display apparatus according to the exemplary embodiment of the present disclosure is described that the side surface 332s of the gate conductive layer 332 is vertically aligned with the side surface 331s of the first hydrogen barrier layer 331. However, in the display apparatus according to another exemplary embodiment of the present disclosure, the gate conductive layer 332 may include a side surface 332s that is not continuous with the side surface 331s of the first hydrogen barrier layer 331. For example, as illustrated in FIGS. 5 and 6, in the display apparatus according to another exemplary embodiment of the present disclosure, the side surface 332s of the gate conductive layer 332 may be located further inwards than the side surface 331s of the first hydrogen barrier layer 331. The gate conductive layer 332 may be formed through the same process as the first hydrogen barrier layer 331. For example, in the display apparatus according to another exemplary embodiment of the present disclosure, the gate conductive layer 332 may be formed of a material having a higher etch rate than the material of the first hydrogen barrier layer 331 with respect to an etchant used in the process of forming the second gate electrode 330. Thus, in the display apparatus according to another exemplary embodiment of the present disclosure, freedom in design of the gate conductive layer 332 may be improved.

The display apparatus according to the exemplary embodiment of the present disclosure is described that the stepped portions 114r are formed at the edge of the surface of the second gate insulating film 114 toward the second gate electrode 330. For example, the second gate insulating film 114 may include a first region having a first thickness and a second region having a second thickness that is smaller than the first thickness. The second region having the second thickness may be located at both side portions of the second gate insulating film 114.

Figure 7:
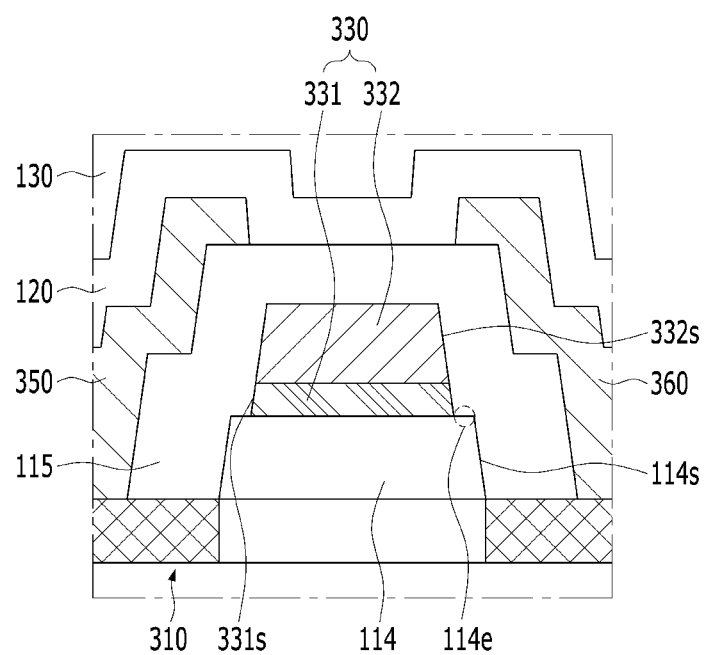
Figure 8:
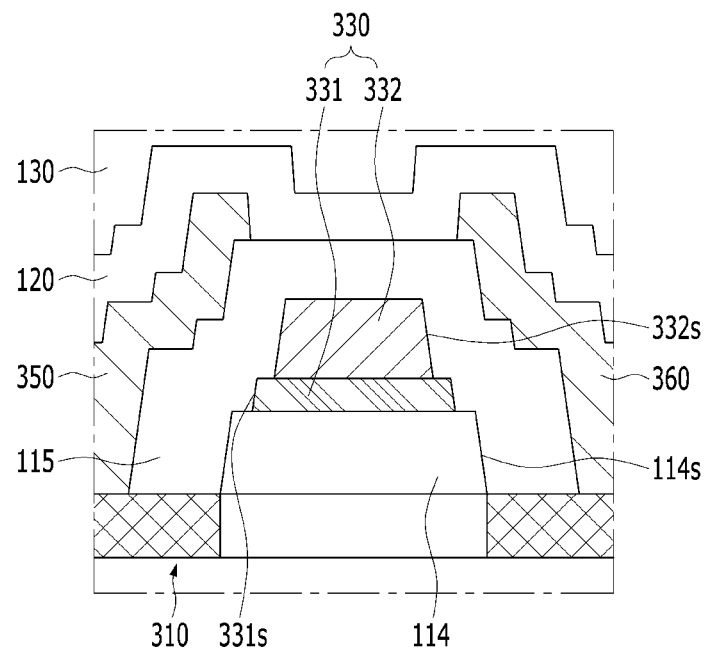

In a display apparatus according to another exemplary embodiment of the present disclosure, the second gate insulating film 114 may not include stepped portions 114r. For example, as illustrated in FIGS. 7 and 8, in the display apparatus according to another exemplary embodiment of the present disclosure, the surface 114e of the second gate insulating film 114 that is exposed by the second gate electrode 330 may have the same level as the surface of the second gate insulating film 114 that is in contact with the second gate electrode 330. Thus, in the display apparatus according to another exemplary embodiment of the present disclosure, it is possible to prevent the occurrence of an electrical short between the second gate electrode 330 and the second semiconductor pattern 310, which may be caused by unintended deposition of an oxide semiconductor on the side surface of the second gate insulating film 114. Therefore, in the display apparatus according to another exemplary embodiment of the present disclosure, the reliability of the driving circuit may be effectively improved.

Figure 9:
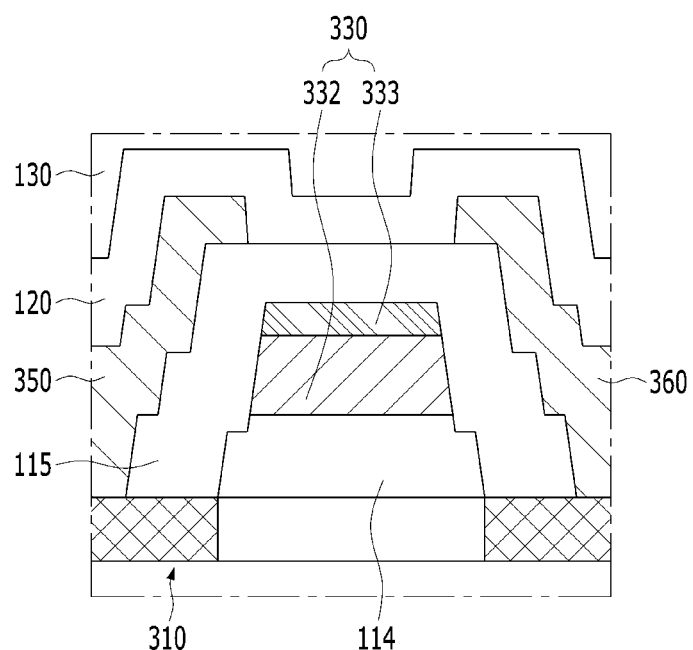

The display apparatus according to the exemplary embodiment of the present disclosure is described that the first hydrogen barrier layer 331 is in contact with the top surface of the second gate insulating film 114. In a display apparatus according to another exemplary embodiment of the present disclosure, the first hydrogen barrier layer of the second gate electrode 330 may not be in direct contact with the top surface of the second gate insulating film 114. For example, as illustrated in FIG. 9, in the display apparatus according to another exemplary embodiment of the present disclosure, the second gate electrode 330 may include a gate conductive layer 332 and a second hydrogen barrier layer 333, which are sequentially stacked on the second gate insulating film 114. Thus, in the display apparatus according to another exemplary embodiment of the present disclosure, the second hydrogen barrier layer 333 may prevent hydrogen from permeating the second channel region 310C of the second semiconductor pattern 310. For example, the hydrogen generated in the second interlayer insulating film 115 may be prevented from permeating the second channel region 310C.

Figure 10:
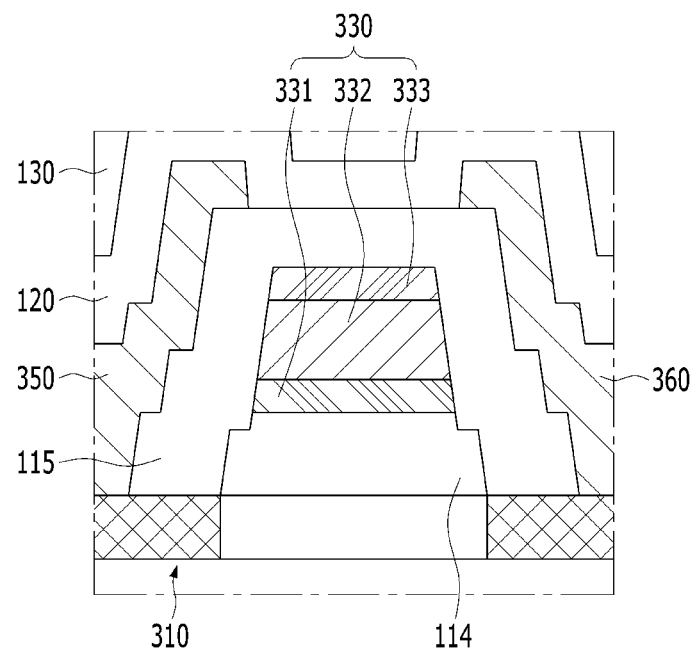

The display apparatus according to the exemplary embodiment of the present disclosure is described that the second gate electrode 330 includes only the first hydrogen barrier layer 331. In a display apparatus according to another exemplary embodiment of the present disclosure, the second gate electrode 330 may include a plurality of hydrogen barrier layers. For example, as illustrated in FIG. 10, in the display apparatus according to another exemplary embodiment of the present disclosure, the second gate electrode 330 may include a gate conductive layer 332 located between the first hydrogen barrier layer 331 and the second hydrogen barrier layer 333. The first hydrogen barrier layer 331, the gate conductive layer 332, and the second hydrogen barrier layer 333 may be formed through the same photolithography process. For example, the side surface of the gate conductive layer 332 may be vertically aligned with the side surface of the second hydrogen barrier layer 333, and the side surface of the first hydrogen barrier layer 331 may be vertically aligned with the side surface of the gate conductive layer 332. Thus, in the display apparatus according to another exemplary embodiment of the present disclosure, the hydrogen generated from the components formed on the thin-film transistor, such as the encapsulating element covering the light-emitting devices, may be blocked by the plurality of hydrogen barrier layers 331 and 333. Therefore, in the display apparatus according to another exemplary embodiment of the present disclosure, it is possible to effectively prevent deterioration in the characteristics of the thin-film transistor due to hydrogen.

Figure 11:
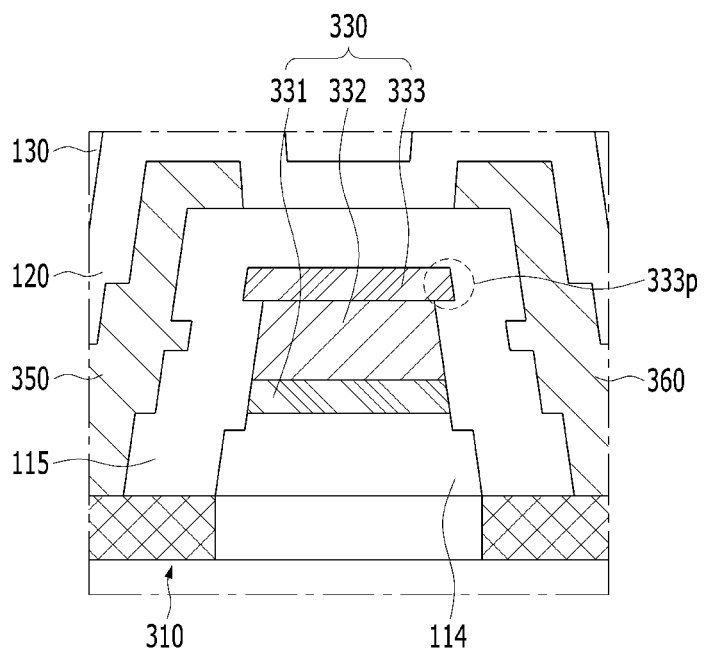

The display apparatus according to another exemplary embodiment of the present disclosure is described that the side surface of the first hydrogen barrier layer 331, the side surface of the gate conductive layer 332, and the side surface of the second hydrogen barrier layer 333 are continuous with each other. In a display apparatus according to further another exemplary embodiment of the present disclosure, the second gate electrode 330 may include a hydrogen barrier layer formed through a different process from the gate conductive layer 332. For example, as illustrated in FIG. 11, in the display apparatus according to further another exemplary embodiment of the present disclosure, the second gate electrode 330 may include a first hydrogen barrier layer 331, a gate conductive layer 332, and a second hydrogen barrier layer 333, which are sequentially stacked, and the second hydrogen barrier layer 333 may include a tip region 333p, which protrudes in the outward direction of the gate conductive layer 332, that is, protrudes to an outside of the gate conductive layer 332. The second hydrogen barrier layer 333 may have a width larger than the gate conductive layer 332. The second hydrogen barrier layer 333 may be formed through a process of forming a barrier material layer on the device substrate 100 in which the first hydrogen barrier layer 331 and the gate conductive layer 332 are formed, and a process of patterning the barrier material layer. Thus, in the display apparatus according to further another exemplary embodiment of the present disclosure, the area in which hydrogen is blocked by the second gate electrode 330 may be increased or maximized.

Figure 12:
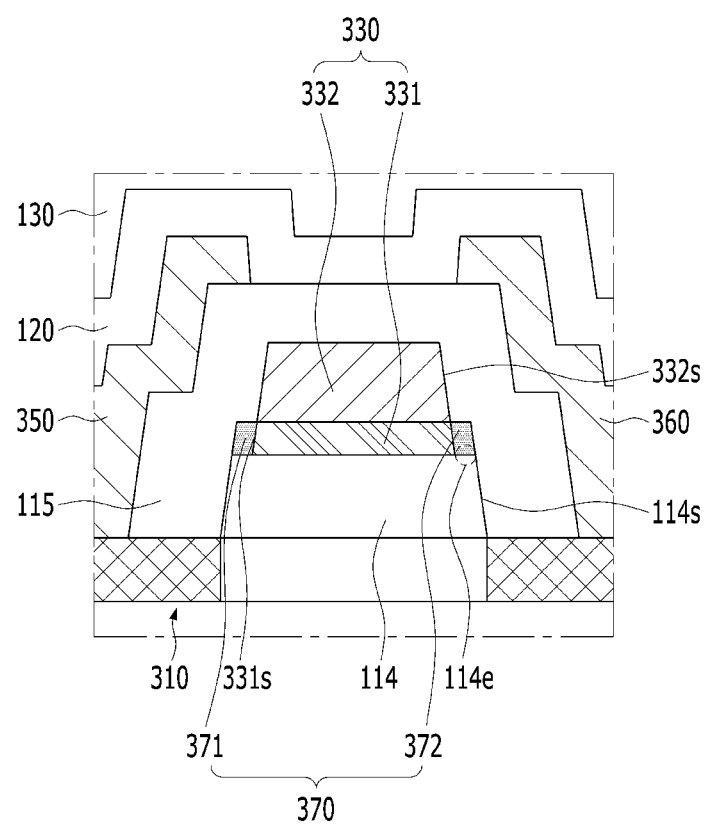

FIG. 12 is a cross-sectional view of a second thin-film transistor 300 in the display apparatus according to another exemplary embodiment of the present disclosure. The second thin-film transistor 300 will now be described with reference to FIGS. 7 and 12, and a duplicate description thereof will be omitted, or will be made briefly.

Referring to FIG. 12, in the display apparatus according to another exemplary embodiment of the present disclosure, the second gate electrode 330 may include a first hydrogen barrier layer 331 and a gate conductive layer 332. In addition, short prevention patterns 370 may be disposed on both sides of the first hydrogen barrier layer 331. The short prevention patterns 370 may include a first short prevention pattern 371 disposed on the left side of the first hydrogen barrier layer 331 and a second short prevention pattern 372 disposed on the right side of the first hydrogen barrier layer 331.

The first hydrogen barrier layer 331 may overlap the gate conductive layer 332. The first short prevention pattern 371 and the second short prevention pattern 372 may not overlap the gate conductive layer 332. Therefore, the top surface of the first hydrogen barrier layer 331 may be in contact with the gate conductive layer 332, and the bottom surface of the first hydrogen barrier layer 331 may be in contact with the second gate insulating film 114. The top surfaces of the short prevention patterns 370 may be in contact with the second interlayer insulating film 115, and the bottom surfaces of the short prevention patterns 370 may be in contact with the second gate insulating film 114. The short prevention patterns 370 may be in contact with the both side surfaces of the first hydrogen barrier layer 331.

The first short prevention pattern 371 and the second short prevention pattern 372 may include a material different from the first hydrogen barrier layer 331. For example, when the first hydrogen barrier layer 331 includes titanium (Ti), the first short prevention pattern 371 and the second short prevention pattern 372 may include a titanium oxide (TiOx)-based material.

Thus, in the display apparatus according to another exemplary embodiment of the present disclosure, the short prevention patterns 370 may prevent the occurrence of an electrical short between the second gate electrode 330 and the second semiconductor pattern 310. Therefore, in the display apparatus according to another exemplary embodiment of the present disclosure, the reliability of the driving circuit may be effectively improved.

Figure 13:
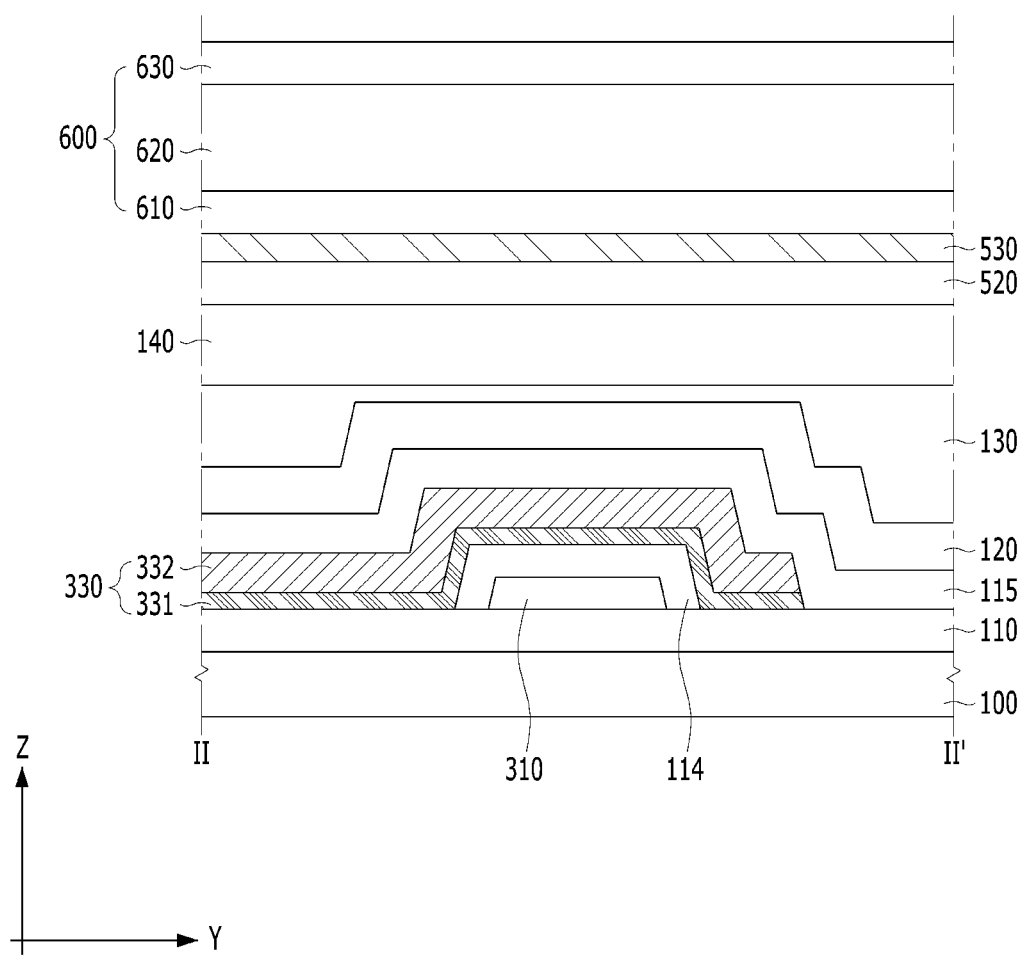

In the display apparatus according to the exemplary embodiment of the present disclosure, the second source region 310S, the second channel region 310C, and the second drain region 310D of the second semiconductor pattern 310 may be disposed side by side in the first direction X, and the second gate electrode 330, which overlaps the second channel region 310C of the second semiconductor pattern 310, may extend in the second direction Y that is perpendicular to the first direction X. For example, as illustrated in FIGS. 1 and 13, in the display apparatus according to the exemplary embodiment of the present disclosure, the second gate insulating film 114 and the second gate electrode 330 may extend in the second direction Y and may be stacked on the second semiconductor pattern 310. Therefore, referring to FIG. 13, the second gate electrode 330 may overlap both side surfaces of the second semiconductor pattern 310. Thus, in the display apparatus according to the exemplary embodiment of the present disclosure, the movement path of electrons, which is formed in the second semiconductor pattern 310 by the second gate electrode 330, may increase. Thereby, in the display apparatus according to the exemplary embodiment of the present disclosure, the operational characteristics of the driving circuit may be improved.

Figure 14:
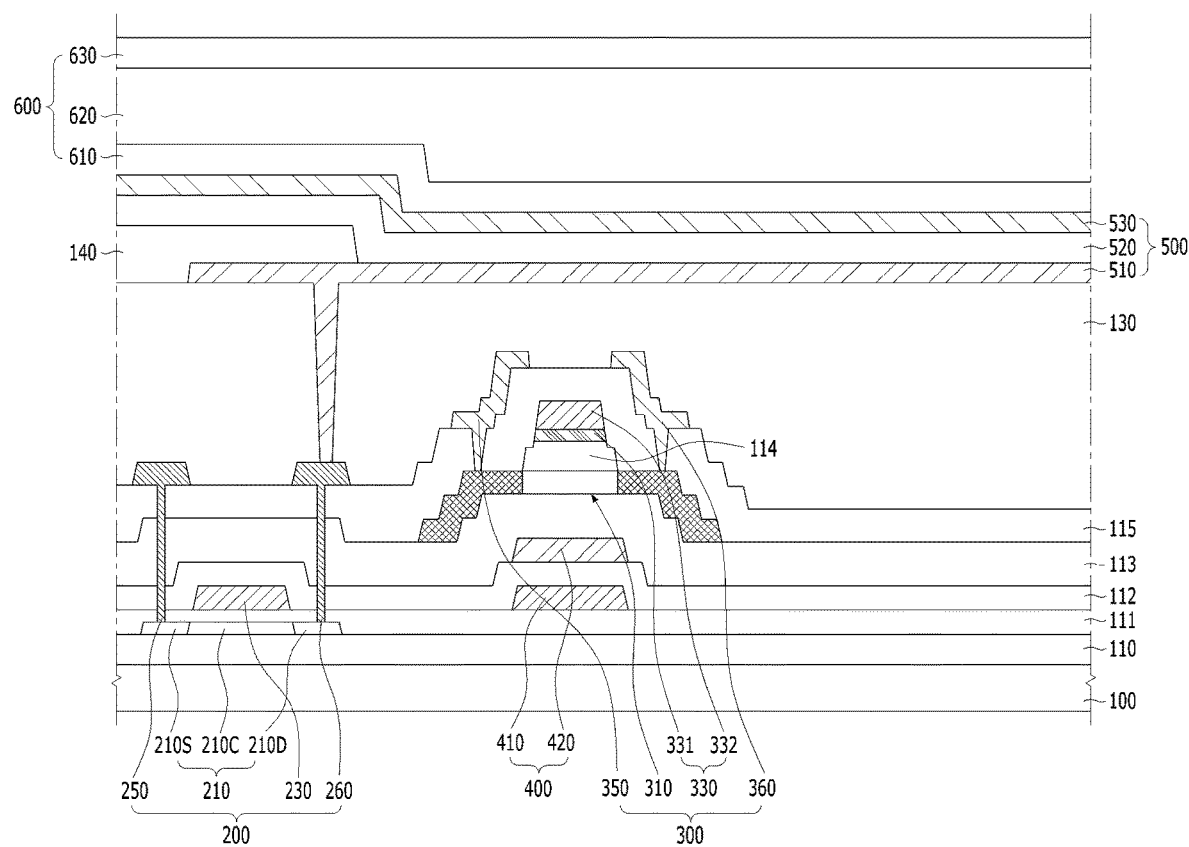

The display apparatus according to the exemplary embodiment of the present disclosure is described that the first thin-film transistor 200 and the second thin-film transistor 300 of the driving circuit have the same structure. In a display apparatus according to another exemplary embodiment of the present disclosure, the driving circuit of each pixel may include the first thin-film transistor 200 having a different structure from the second thin-film transistor 300. For example, as illustrated in FIG. 14, in a display apparatus according to another exemplary embodiment of the present disclosure, the driving circuit of each pixel may include a first thin-film transistor 200, a second thin-film transistor 300, and a storage capacitor 400. The second semiconductor pattern 310 of the second thin-film transistor 300 may be disposed on a layer different from the first semiconductor pattern 210 of the first thin-film transistor 200. The first semiconductor pattern 210 of the first thin-film transistor 200 may not include an oxide semiconductor. The first semiconductor pattern 210 of the first thin-film transistor 200 may include poly-silicon (poly-Si). For example, the first semiconductor pattern 210 may include low temperature poly-silicon (LTPS). The first gate insulating film 111 may extend beyond the semiconductor pattern 210 of the first thin-film transistor 200. The first source electrode 250 and the first drain electrode 260 of the first thin-film transistor 200 may be located in the same layer as the second source electrode 350 and the second drain electrode 360 of the second thin-film transistor 300. For example, a second buffer layer (second buffer insulating film) 113 may be located between the first interlayer insulating film 112 covering the first gate electrode 230 of the first thin-film transistor 200, and the second semiconductor pattern 310 of the second thin-film transistor 300. The storage capacitor 400 may be located between the substrate 100 and the second buffer layer 113. For example, the storage capacitor 400 may include a first storage electrode 410, which is located in the same layer as the first gate electrode 230 of the first thin-film transistor 200, and a second storage electrode 420, which is located between the first interlayer insulating film 112 of the first thin-film transistor 200 and the second buffer layer 113. The first storage electrode 410 may include the same material as the first gate electrode 230 of the first thin-film transistor 200.

The display apparatus according to the exemplary embodiment of the present disclosure is described that the second thin-film transistor 300, which is connected to the light-emitting device 500, includes the second semiconductor pattern 310. In a display apparatus according to another exemplary embodiment of the present disclosure, as illustrated in FIG. 14, the light-emitting device 500 of each pixel may be electrically connected to the first thin-film transistor 200, which includes the first semiconductor pattern 210 formed of poly-silicon. For example, in the display apparatus according to another exemplary embodiment of the present disclosure, the second thin-film transistor 300 including the second semiconductor pattern 310 in the driving circuit located in each pixel may be a switching thin-film transistor for controlling on/off of the first thin-film transistor 200. The first thin-film transistor 200 may be a driving thin-film transistor for supplying current to the light-emitting device 500.

Figure 15:
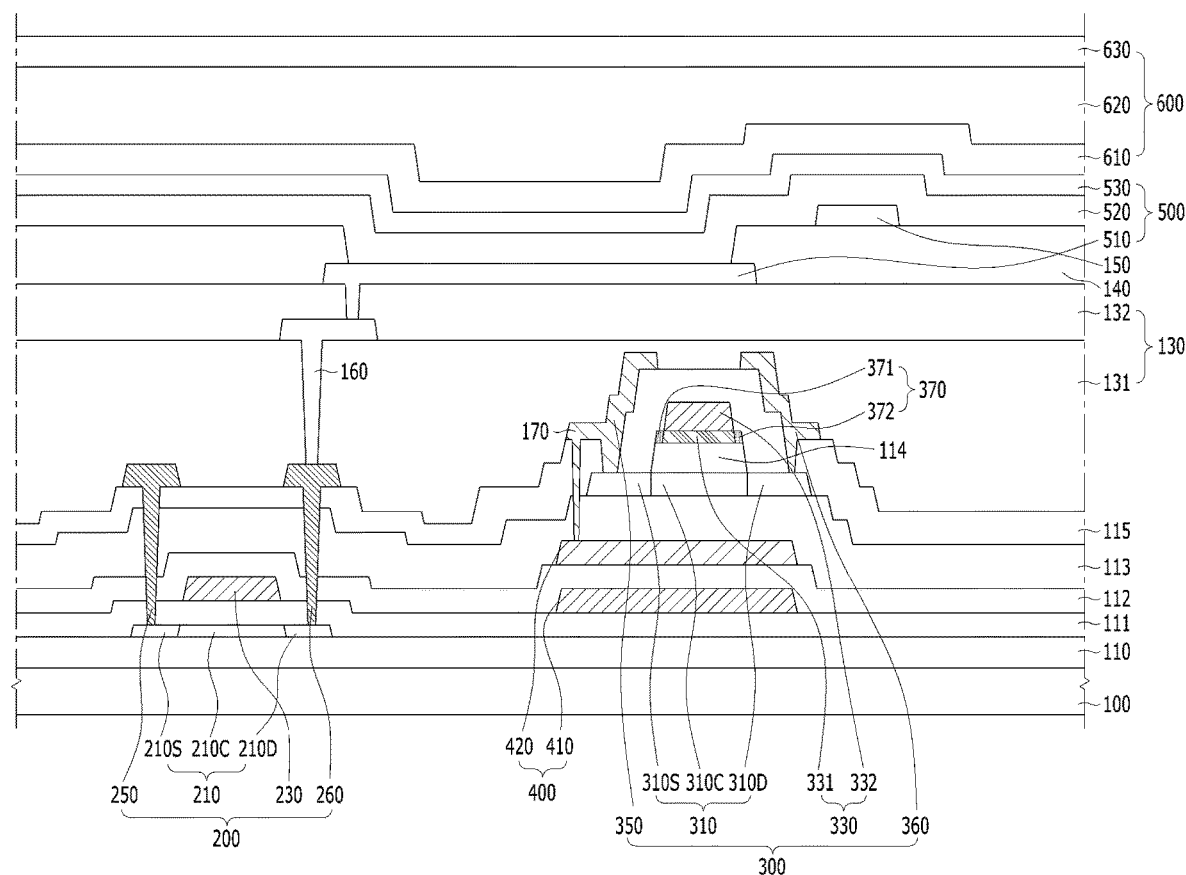

FIG. 15 is a cross-sectional view illustrating a display apparatus according to another exemplary embodiment of the present disclosure.

Referring to FIG. 15, the display apparatus according to another exemplary embodiment of the present disclosure may include a substrate 100, a first buffer layer 110, a first gate insulating film 111, a first interlayer insulating film 112, a second buffer layer 113, a second gate insulating film 114, a second interlayer insulating film 115, an over-coat layer 130, a bank insulating film 140, a spacer 150, an auxiliary electrode 160, a connection electrode 170, short prevention patterns 370, a first thin-film transistor 200, a second thin-film transistor 300, a storage capacitor 400, a light-emitting device 500, and an encapsulating element 600.

The substrate 100 may support various components of the display apparatus. The substrate 100 may be formed of glass or a plastic material having flexibility. When the substrate 100 is formed of a plastic material, it may be formed of, for example, polyimide (PI). When the substrate 100 is formed of polyimide (PI), a process of forming the display apparatus may be performed in the state in which a support substrate made of glass is disposed under the substrate 100, and the support substrate may be released after the process of forming the display apparatus is completed. And, after the support substrate is released, a back plate for supporting the substrate 100 may be disposed under the substrate 100.

When the substrate 100 is formed of polyimide (PI), moisture may pass through the substrate 100 formed of polyimide (PI), and may permeate the first thin-film transistor 200 or the light-emitting device 500, so that the performance of the display apparatus may be deteriorated. In the display apparatus according to another exemplary embodiment of the present disclosure, in order to prevent the performance of the display apparatus from being deteriorated by the permeation of moisture, the substrate 100 may have a structure in which an inorganic film may be interposed between the two polyimide (PI) films. Thus, in the display apparatus according to the present disclosure, the reliability of the display apparatus may be improved by preventing the moisture from passing through the lower polyimide (PI) film.

Further, when the inorganic film is not formed between the two polyimide (PI) films, electric charges charged in the lower polyimide film (PI) may form back bias, which may adversely affect the first thin-film transistor 200 or the second thin-film transistor 300. Therefore, it is required to form another metal layer in order to block the electric charges charged in the polyimide (PI) film. However, the display apparatus according to another exemplary embodiment of the present disclosure may include an inorganic film interposed between the two polyimide (PI) films. Thereby, in the display apparatus according to another exemplary embodiment of the present disclosure, the electric charges charged in the lower polyimide (PI) film may be blocked, and the reliability of the product may be improved. The inorganic film may be formed in a single-layer structure of silicon nitride (SiNx) or silicon oxide (SiOx), or may be formed in a multi-layer structure of silicon nitride (SiNx) and silicon oxide (SiOx). The inorganic film may be formed of, for example, silica or silicon dioxide (SiO2). In addition, since the process of forming a metal layer to block the electric charges charged in the polyimide (PI) film may be omitted, the process may be simplified, and manufacturing costs may be reduced.

The first buffer layer 110 may be formed on the entire surface of the substrate 100. The first buffer layer 110 may be formed in a single-layer structure of silicon nitride (SiNx) or silicon oxide (SiOx), or may be formed in a multi-layer structure of silicon nitride (SiNx) and silicon oxide (SiOx). According to the exemplary embodiment of the present disclosure, the first buffer layer 110 may be formed in a multi-layer structure in which silicon oxide (SiOx) and silicon nitride (SiNx) are alternately formed. For example, the first buffer layer 110 may include "n+1" layers. Here, "n" may be an even number including 0, such as 0, 2, 4, 6, and 8. When "n" is 0, the first buffer layer 110 is formed in a single-layer structure. In this case, the first buffer layer 110 may be a silicon nitride (SiNx) film or a silicon oxide (SiOx) film. When "n" is 2, the first buffer layer 110 may be formed in a triple-layer structure. When the first buffer layer 110 is formed in a triple-layer structure, the upper layer and the lower layer may be formed as silicon oxide (SiOx) films, and the intermediate layer disposed between the upper layer and the lower layer may be formed as a silicon nitride (SiNx) film. When "n" is 4, the first buffer layer 110 may be formed in a quintuple-layer structure.

When the first buffer layer 110 is formed in a multi-layer structure in which silicon oxide (SiOx) and silicon nitride (SiNx) are alternately formed, the uppermost layer and the lowermost layer of the first buffer layer 110 may be formed of a silicon oxide (SiOx) material. For example, the first buffer layer 110, which is composed of multiple layers, may include an upper layer, which is in contact with the first semiconductor pattern 210 of the first thin-film transistor 200, a lower layer, which is in contact with the substrate 100, and an intermediate layer disposed between the upper layer and the lower layer. The upper layer and the lower layer may be formed of a silicon oxide (SiOx) material. In the first buffer layer 110 formed in a multi-layer structure, the upper layer may be formed to have a larger thickness than the lower layer and the intermediate layer.

The first thin-film transistor 200 may be disposed on the first buffer layer 110. The first thin-film transistor 200 may include a first semiconductor pattern 210, a first gate electrode 230, a first source electrode 250, and a first drain electrode 260. However, the disclosure is not limited thereto. The first source electrode 250 may be a drain electrode, and the first drain electrode 260 may be a source electrode.

The first semiconductor pattern 210 of the first thin-film transistor 200 may be disposed on the first buffer layer 110. The first semiconductor pattern 210 may include poly-silicon (poly-Si). For example, the first semiconductor pattern 210 may include low temperature poly-silicon (LTPS). Since the poly-silicon material has characteristics of high mobility (100 cm$^2$/Vs or more), lower energy consumption power, and high reliability, it may be applied to a gate driver and/or a multiplexer (MUX) for driving elements for driving thin-film transistors for display elements. In the display apparatus according to the exemplary embodiment of the present disclosure, the poly-silicon material may be applied to the semiconductor pattern of the driving thin-film transistor. However, the disclosure is not limited thereto. For example, the poly-silicon material may also be applied to the semiconductor pattern of the switching thin-film transistor. According to the exemplary embodiment of the present disclosure, the first semiconductor pattern 210 of the first thin-film transistor 200 is applied as a semiconductor pattern of the driving thin-film transistor. Thus, the first thin-film transistor 200 may be a driving thin-film transistor that is electrically connected to the first electrode 510 and supplies current to the light-emitting device 500. An amorphous silicon (a-Si) material may be deposited on the first buffer layer 110, and a poly-silicon layer may be formed through a crystallization process. The first semiconductor pattern 210 may be formed by patterning the poly-silicon layer.

The first semiconductor pattern 210 may include a first channel region 210C, in which a channel is formed when the first thin-film transistor 200 is driven, and first source and drain regions 210S and 210D, which are disposed on both sides of the first channel region 210C. The first source region 210S may be a part of the first semiconductor pattern 210 that is connected to the first source electrode 250, and the first drain region 210D may be a part of the first semiconductor pattern 210 that is connected to the first drain electrode 260. The first source region 210S and the first drain region 210D may be formed by performing ion doping (impurity doping) on the first semiconductor pattern 210. The first source region 210S and the first drain region 210D may be generated by performing ion doping on the poly-silicon material, and the first channel region 210C may be a remaining part including an undoped poly-silicon material.

The first gate insulating film 111 may be disposed on the first semiconductor pattern 210 of the first thin-film transistor 200. The first gate insulating film 111 may be formed in a single-layer structure of silicon nitride (SiNx) or silicon oxide (SiOx), or may be formed in a multi-layer structure of silicon nitride (SiNx) and silicon oxide (SiOx).

The first gate electrode 230 of the first thin-film transistor 200 and the first storage electrode 410 of the storage capacitor 400 may be disposed on the first gate insulating film 111.

The first gate electrode 230 and the first storage electrode 410 may be formed in a single-layered or multi-layered structure including a material selected from the group consisting of molybdenum (Mo), copper (Cu), titanium (Ti), aluminum (Al), chromium (Cr), gold (Au), nickel (Ni), neodymium (Nd), and alloys thereof.

A first interlayer insulating film 112 may be disposed on the first gate insulating film 111, the first gate electrode 230, and the first storage electrode 410. The first interlayer insulating film 112 may be formed in a single-layered structure including silicon nitride (SiNx) or silicon oxide (SiOx), or may be formed in a multi-layered structure including silicon nitride (SiNx) and silicon oxide (SiOx).

The second storage electrode 420 of the storage capacitor 400 may be disposed on the first interlayer insulating film 112. The second storage electrode 420 may be formed in a single-layered or multi-layered structure including a material selected from the group consisting of molybdenum (Mo), copper (Cu), titanium (Ti), aluminum (Al), chromium (Cr), gold (Au), nickel (Ni), neodymium (Nd), and alloys thereof. The second storage electrode 420 may overlap the first storage electrode 410, with the first interlayer insulating film 112 interposed therebetween. The second storage electrode 420 may be formed of the same material as the first storage electrode 410. The second storage electrode 420 may be omitted depending on the driving characteristics of the display apparatus and the structure and type of the thin-film transistor.

A second buffer layer 113 may be disposed on the first interlayer insulating film 112 and the second storage electrode 420. The second buffer layer 113 may be formed in a single-layered structure including silicon nitride (SiNx) or silicon oxide (SiOx), or may be formed in a multi-layered structure including silicon nitride (SiNx) and silicon oxide (SiOx).

The second semiconductor pattern 310 of the second thin-film transistor 300 may be disposed on the second buffer layer 113. The second semiconductor pattern 310 may be an oxide semiconductor pattern made of an oxide semiconductor. The second thin-film transistor 300 may include a second semiconductor pattern 310, a second gate electrode 330, a second source electrode 350, and a second drain electrode 360. Alternatively, the second source electrode 350 may be a drain electrode, and the second drain electrode 360 may be a source electrode.

The second semiconductor pattern 310 may include a second channel region 310C, in which a channel is formed when the second thin-film transistor 300 is driven, and second source and drain regions 310S and 310D, which are formed on both sides of the second channel region 310C. The second source region 310S may be a part of the second semiconductor pattern 310 that is connected to the second source electrode 350, and the second drain region 310D may be a part of the second semiconductor pattern 310 that is connected to the second drain electrode 360.

Since the oxide semiconductor material of the second semiconductor pattern 310 has a larger band gap than the poly-silicon material, electrons hardly cross the band gap in an off state, and accordingly off-current is low. Therefore, the thin-film transistor including an active layer made of an oxide semiconductor may be suitable for a switching thin-film transistor having a short on time and a long off time. However, the disclosure is not limited thereto. For example, the thin-film transistor including an active layer made of an oxide semiconductor may also be applied to a driving thin-film transistor. Further, since the off-current is low, the magnitude of auxiliary capacitance may be reduced, and thus the thin-film transistor is suitable for a high-resolution display element. Referring to FIG. 15, the second thin-film transistor 300 including an oxide semiconductor is used as a switching thin-film transistor of the display apparatus. The second semiconductor pattern 310 may be made of metal oxide. For example, the second semiconductor pattern 310 may be made of any of various kinds of metal oxide, such as indium-gallium-zinc-oxide (IGZO). Although the second semiconductor pattern 310 of the second thin-film transistor 300 is described as being formed as an IGZO layer among various kinds of metal oxide, the disclosure is not limited thereto. For example, the second semiconductor pattern 310 of the second thin-film transistor 300 may be formed of any of various kinds of metal oxide, such as indium-zinc-oxide (IZO), indium-gallium-tin-oxide (IGTO), or indium-gallium-oxide (IGO), other than IGZO.

The second gate insulating film 114 and the second gate electrode 330 may be formed on the second semiconductor pattern 310. The second gate electrode 330 may overlap the second semiconductor pattern 310, with the second gate insulating film 114 interposed therebetween. For example, the second gate electrode 330 may overlap the second channel region 310C of the second semiconductor pattern 310, with the second gate insulating film 114 interposed therebetween.

The second gate insulating film 114 may be disposed on the second semiconductor pattern 310. The second gate insulating film 114 may be formed in a single-layered structure including silicon nitride (SiNx) or silicon oxide (SiOx), or may be formed in a multi-layered structure including silicon nitride (SiNx) and silicon oxide (SiOx). The second gate insulating film 114 may overlap the second channel region 310C of the second semiconductor pattern 310, and may be patterned so as to expose the second source region 310S and the second drain region 310D.

The second gate electrode 330 may be disposed on the second gate insulating film 114. The second gate electrode 330 may overlap the second gate insulating film 114 and the second channel region 310C.

The second gate electrode 330 may include a gate conductive layer 332 and a first hydrogen barrier layer 331. The first hydrogen barrier layer 331 may be disposed on the second gate insulating film 114, and the gate conductive layer 332 may be disposed on the first hydrogen barrier layer 331. Therefore, the gate conductive layer 332 may overlap the second gate insulating film 114 and the second channel region 310C, with the first hydrogen barrier layer 331 interposed therebetween.

The first hydrogen barrier layer 331 may prevent hydrogen generated by components formed by a subsequent process from permeating the second channel region 310C of the second semiconductor pattern 310. For example, the first hydrogen barrier layer 331 may include a hydrogen storage material or a hydrogen-blocking material. The first hydrogen barrier layer 331 may include a conductive material. For example, the first hydrogen barrier layer 331 may be a metal material capable of being stably combined with hydrogen (H). For example, the first hydrogen barrier layer 331 may be a metal material such as titanium (Ti), calcium (Ca), yttrium (Y), magnesium (Mg), tantalum (Ta), or vanadium (V). Alternatively, the first hydrogen barrier layer 331 may be an alloy including titanium (Ti).

The first hydrogen barrier layer 331 may be in direct contact with the top surface of the second gate insulating film 114. The width of the bottom surface of the first hydrogen barrier layer 331 may be smaller than the width of the top surface of the second gate insulating film 114 in the first direction X.

Both side surfaces of the first hydrogen barrier layer 331 may be located further inwards than both side surfaces of the second gate insulating film 114.

The second gate insulating film 114 may have protruding portions that protrude from both ends of the second gate electrode 330 without overlapping the second gate electrode 330. As illustrated in FIG. 3, the second gate insulating film 114 may extend without overlapping the first hydrogen barrier layer 331. Therefore, the second gate insulating film 114 may have protruding portions that protrude from both ends of the first hydrogen barrier layer 331 of the second gate electrode 330. For example, the side surface 114s of the second gate insulating film 114 may be located further outwards than the side surface 331s of the first hydrogen barrier layer 331. Therefore, the second gate insulating film 114 may have protruding portions that protrude from the side surface 331s of the first hydrogen barrier layer 331. The protruding portions of the second gate insulating film 114 do not overlap the first hydrogen barrier layer 331.

Referring to FIG. 15, in a display apparatus according to another exemplary embodiment of the present disclosure, short circuit prevention patterns 370 may be formed on both sides of the first hydrogen barrier layer 331. The short circuit prevention patterns 370 may include a first short circuit prevention pattern 371 disposed on the left side of the first hydrogen barrier layer 331 and a second short circuit prevention pattern 372 disposed on the right side of the first hydrogen barrier layer 331. For example, the first short circuit prevention pattern 371 and the second short circuit prevention pattern 372 may be located at the protruding portions of the second gate insulating film 114. Therefore, the short circuit prevention patterns 370 may be located at the protruding portions of the second gate insulating film 114.

The first hydrogen barrier layer 331 may overlap the gate conductive layer 332. The first short circuit prevention pattern 371 and the second short circuit prevention pattern 372 may not overlap the gate conductive layer 332. Therefore, the top surface of the first hydrogen barrier layer 331 may be in contact with the gate conductive layer 332, and the bottom surface of the first hydrogen barrier layer 331 may be in contact with the second gate insulating film 114. The top surfaces of the short circuit prevention patterns 370 may be in contact with the second interlayer insulating film 115, and the bottom surfaces of the short circuit prevention patterns 370 may be in contact with the second gate insulating film 114. The short circuit prevention patterns 370 may be in contact with both side surfaces of the first hydrogen barrier layer 331.

The first short circuit prevention pattern 371 and the second short circuit prevention pattern 372 may be formed of a different material from the first hydrogen barrier layer 331. For example, when the first hydrogen barrier layer 331 includes titanium (Ti), the first short circuit prevention pattern 371 and the second short circuit prevention pattern 372 may include a titanium oxide (TiOx)-based material.

Accordingly, in the display apparatus according to another exemplary embodiment of the present disclosure, an electrical short between the second gate electrode 330 and the oxide semiconductor pattern 310 may be prevented by the short circuit prevention patterns 370. Therefore, in the display apparatus according to another exemplary embodiment of the present disclosure, the reliability of the driving circuit may be effectively improved.

For example, a wet etching process may be performed to form the second gate electrode 330 on the second gate insulating film 114. During the wet etching process for forming the second gate electrode 330, the material of the oxide semiconductor pattern 310 may be deposited on the side surface 114s of the second gate insulating film 114 by an etchant. For example, indium (In) included in the oxide semiconductor pattern 310 may be deposited on the side surface 114s of the second gate insulating film 114, and may remain as a residual film. An electrical short may occur between the oxide semiconductor pattern 310 and the second gate electrode 330 due to the residual indium (In) film deposited on the side surface 114s of the second gate insulating film 114. However, in the display apparatus according to an exemplary embodiment of the present disclosure, it is possible to prevent the occurrence of an electrical short between the oxide semiconductor pattern 310 and the second gate electrode 330 due to the residual indium (In) film by forming the short circuit prevention patterns 370 on opposite sides of the first hydrogen barrier layer 331.

The gate conductive layer 332 on the first hydrogen barrier layer 331 may include a metal material. The resistance of the gate conductive layer 332 may be lower than that of the first hydrogen barrier layer 331. For example, the gate conductive layer 332 may include metal such as molybdenum (Mo), aluminum (Al), chromium (Cr), tungsten (W), or copper (Cu). The thickness of the gate conductive layer 332 may be greater than the thickness of the first hydrogen barrier layer 331. Accordingly, in the display apparatus according to an exemplary embodiment of the present disclosure, signal delay attributable to the first hydrogen barrier layer 331 may be reduced or minimized.

The metal of the gate conductive layer 332, such as molybdenum (Mo), aluminum (Al), chromium (Cr), tungsten (W), or copper (Cu), may be unstably combined with hydrogen (H), compared with the first hydrogen barrier layer 331. During the deposition process for forming the second interlayer insulating film 115 on the gate conductive layer 332, hydrogen (H) in the chamber may be unstably combined with the metal material of the gate conductive layer 332. The unstable combination between the metal material of the gate conductive layer 332 and hydrogen (H) may be released in a heat treatment process, which is a subsequent process. When the combination between the metal of the gate conductive layer 332 and hydrogen (H) is released, the hydrogen (H) discharged from the gate conductive layer 332 may permeate the second semiconductor pattern 310 of the second thin-film transistor 300. The hydrogen (H) permeating the second semiconductor pattern 310 may be subjected to rehydrogenation in the second semiconductor pattern 310, which may cause deterioration in the characteristics of the second thin-film transistor 300.

Therefore, the first hydrogen barrier layer 331, which is disposed between the bottom surface of the gate conductive layer 332 and the top surface of the second gate insulating film 114, may be combined with the hydrogen (H) discharged from the gate conductive layer 332. Accordingly, the first hydrogen barrier layer 331, which is made of a metal material capable of being stably combined with hydrogen (H), may be stably combined with the hydrogen (H) generated in the process of manufacturing the first hydrogen barrier layer 331, and thus may prevent the hydrogen (H) from permeating the second channel region 310C of the second semiconductor pattern 310. In addition, it is possible to prevent rehydrogenation of the second channel region 310C, thus preventing deterioration in the characteristics of the second thin-film transistor 300.

The gate conductive layer 332 may be formed together with the first hydrogen barrier layer 331. For example, the side surface of the gate conductive layer 332 may be continuously aligned with the side surface of the first hydrogen barrier layer 331 without a stepped portion therebetween. Therefore, the width of the top surface of the first hydrogen barrier layer 331 and the width of the bottom surface of the gate conductive layer 332 may be the same.

The second interlayer insulating film 115 may be disposed on the gate electrode 330, the second semiconductor pattern 310, and the second buffer insulating film 113. The second interlayer insulating film 115 may be formed in a single-layered structure including a silicon oxide (SiOx)-based material or a silicon nitride (SiNx)-based material, or may be formed in a multi-layered structure including a silicon oxide (SiOx)-based material and a silicon nitride (SiNx)-based material.

A contact hole for exposing the second semiconductor pattern 310 of the second thin-film transistor 300 may be formed by etching the second interlayer insulating film 115. For example, a contact hole exposing the second source region 310S and the second drain region 310D of the second semiconductor pattern 310 may be formed in the second interlayer insulating film 115.

In addition, contact holes for exposing the first semiconductor pattern 210 of the first thin-film transistor 200 may be formed by etching the second interlayer insulating film 115, the second buffer insulating film 113, the first interlayer insulating film 112, and the first gate insulating film 111. For example, contact holes for exposing the first source region 210S and the first drain region 210D of the first semiconductor pattern 210 may be formed by etching the second interlayer insulating film 115, the second buffer insulating film 113, the first interlayer insulating film 112, and the first gate insulating film 111.

In addition, contact holes for exposing the second storage electrode 420 may be formed by etching the second interlayer insulating film 115 and the second buffer insulating film 113.

The connection electrode 170, the first source and drain electrodes 250 and 260 of the first thin-film transistor 200, and the second source and drain electrodes 350 and 360 of the second thin-film transistor 300 may be disposed on the second interlayer insulating film 115.

The first source electrode 250 and the first drain electrode 260 of the first thin-film transistor 200 may be connected to the first source region 210S and the first drain region 210D of the first semiconductor pattern 210 through the contact holes formed in the second interlayer insulating film 115, the second buffer insulating film 113, the first interlayer insulating film 112, and the first gate insulating film 111.

The second source electrode 350 and the second drain electrode 360 of the second thin-film transistor 300 may be connected to the second source region 310S and the second drain region 310D of the second semiconductor pattern 310 through the contact hole formed in the second interlayer insulating film 115.

The connection electrode 170 may be electrically connected to the second source electrode 350 of the second thin-film transistor 300. Alternatively, the connection electrode 170 may be connected to the second drain electrode 360 of the second thin-film transistor 300. The connection electrode 170 may be electrically connected to the second storage electrode 420 of the storage capacitor 400 through the contact holes formed in the second interlayer insulating film 115 and the second buffer insulating film 113. Therefore, the connection electrode 170 may electrically connect the storage capacitor 400 to the second thin-film transistor 300. The connection electrode 170 may be integrally connected to the second source electrode 350 of the second thin-film transistor 300. Alternatively, the connection electrode 170 may be integrally connected to the second drain electrode 360 of the second thin-film transistor 300.

The connection electrode 170, the first source and drain electrodes 250 and 260 of the first thin-film transistor 200, and the second source and drain electrodes 350 and 360 of the second thin-film transistor 300 may be formed through the same process. The connection electrode 170, the first source and drain electrodes 250 and 260 of the first thin-film transistor 200, and the second source and drain electrodes 350 and 360 of the second thin-film transistor 300 may be formed of the same material, and may be disposed in the same layer. For example, as illustrated in FIG. 15, the connection electrode 170, the first source and drain electrodes 250 and 260 of the first thin-film transistor 200, and the second source and drain electrodes 350 and 360 of the second thin-film transistor 300 may be disposed so as to be in contact with the top surface of the second interlayer insulating film 115. The connection electrode 170, the first source and drain electrodes 250 and 260 of the first thin-film transistor 200, and the second source and drain electrodes 350 and 360 of the second thin-film transistor 300 may be formed in a single-layered or multi-layered structure including a material selected from the group consisting of molybdenum (Mo), copper (Cu), titanium (Ti), aluminum (Al), chromium (Cr), gold (Au), nickel (Ni), neodymium (Nd), and alloys thereof.

An overcoat layer 130 may be formed on the connection electrode 170, the first source and drain electrodes 250 and 260 of the first thin-film transistor 200, the second source and drain electrodes 350 and 360 of the second thin-film transistor 300, and the second interlayer insulating film 115. The overcoat layer 130 may include a first overcoat layer 131 and a second overcoat layer 132.

The first overcoat layer 131 may be disposed on the connection electrode 170, the first source and drain electrodes 250 and 260 of the first thin-film transistor 200, the second source and drain electrodes 350 and 360 of the second thin-film transistor 300, and the second interlayer insulating film 115.

A contact hole for exposing the first drain electrode 260 of the first thin-film transistor 200 may be formed in the first overcoat layer 131. However, the disclosure is not limited thereto. A contact hole for exposing the first source electrode 250 of the first thin-film transistor 200 may be formed in the first overcoat layer 131. The first overcoat layer 131 may be an organic material layer. For example, the first overcoat layer 131 may be formed of an organic material such as acrylic resin, epoxy resin, phenolic resin, polyamide resin, or polyimide resin.

An auxiliary electrode 160 may be disposed on the first overcoat layer 132. The auxiliary electrode 160 may be connected to the first drain electrode 260 of the first thin-film transistor 200 through the contact hole in the first overcoat layer 131. The auxiliary electrode 160 may electrically connect the first thin-film transistor 200 to the first electrode 510. The auxiliary electrode 160 may be formed in a single-layered or multi-layered structure including a material selected from the group consisting of molybdenum (Mo), copper (Cu), titanium (Ti), aluminum (Al), chromium (Cr), gold (Au), nickel (Ni), neodymium (Nd), and alloys thereof. The auxiliary electrode 160 may be formed of the same material as the first source electrode 250 and the first drain electrode 260 of the first thin-film transistor 200.

The second overcoat layer 132 may be disposed on the auxiliary electrode 160 and the first overcoat layer 131. As illustrated in FIG. 15, a contact hole for exposing the auxiliary electrode 160 may be formed in the second overcoat layer 132. The second overcoat layer 132 may be an organic material layer. For example, the second overcoat layer 132 may be formed of an organic material such as acrylic resin, epoxy resin, phenolic resin, polyamide resin, or polyimide resin.

The first electrode 510 of the light-emitting device 500 may be disposed on the second overcoat layer 132. The first electrode 510 may be electrically connected to the auxiliary electrode 160 through the contact hole formed in the second overcoat layer 132. Therefore, the first electrode 510 may be connected to the auxiliary electrode 160 through the contact hole formed in the second overcoat layer 132, and thus may be electrically connected to the first thin-film transistor 200. The first thin-film transistor 200 connected to the first electrode 510 may be a driving thin-film transistor that supplies current to the light-emitting device 500.

The first electrode 510 may be formed in a multi-layered structure including a transparent conductive film and an opaque conductive film having high reflection efficiency. The transparent conductive film may be formed of a material having a relatively high work function, such as indium-tin-oxide (ITO) or indium-zinc-oxide (IZO). The opaque conductive film may be formed in a single-layered or multi-layered structure including a material selected from the group consisting of aluminum (Al), silver (Ag), copper (Cu), lead (Pb), molybdenum (Mo), titanium (Ti), and alloys thereof. For example, the first electrode 510 may be formed in a structure such that a transparent conductive film, an opaque conductive film, and a transparent conductive film are sequentially formed. However, the disclosure is not limited thereto. For example, a transparent conductive film and an opaque conductive film may be sequentially formed.

Since the display apparatus according to an exemplary embodiment of the present disclosure is a top-emission-type display apparatus, the first electrode 510 may be an anode. When the display apparatus is of a bottom emission type, the first electrode 510 disposed on the second overcoat layer 132 may be a cathode.

A bank insulating film 140 may be disposed on the first electrode 510 and the second overcoat layer 132. An opening for exposing the first electrode 510 may be formed in the bank insulating film 140. The bank insulating film 140 may define an emission region of the display apparatus, and thus may be referred to as a pixel defining film. A spacer 150 may be further disposed on the bank insulating film 140. A light-emitting layer 520 of the light-emitting device 500 may be further disposed on the first electrode 510.

The light-emitting layer 520 may be configured such that a hole layer (HL), an emission material layer (EML), and an electron layer (EL) are formed on the first electrode 510 in that order or in the reverse order.

The light-emitting layer 520 may include a first emission layer and a second emission layer, with a charge generation layer (CGL) interposed therebetween. In this case, the emission material layer of any one of the first emission layer and the second emission layer may generate blue light, and the emission material layer of the remaining one of the first emission layer and the second emission layer may generate yellow-green light, with the result that white light may be generated through the first emission layer and the second emission layer. Since the white light generated through the first emission layer and the second emission layer is introduced into a color filter disposed on the emission layer, a color image may be realized. Alternatively, it is possible to realize a color image in a manner such that each emission layer generates colored light corresponding to each subpixel without a separate color filter. For example, an emission layer of a red (R) subpixel may generate red light, an emission layer of a green (G) subpixel may generate green light, and an emission layer of a blue (B) subpixel may generate blue light.

Referring to FIG. 15, a second electrode 530 of the light-emitting device 500 may be further disposed on the light-emitting layer 520. The second electrode 530 may overlap the first electrode 510, with the light-emitting layer 520 interposed therebetween. In the display apparatus according to an exemplary embodiment of the present disclosure, the second electrode 530 may be a cathode.

An encapsulation member 600 for preventing the permeation of moisture may be further disposed on the second electrode 530. The encapsulation member 600 may include a first encapsulation layer 610, a second encapsulation layer 620, and a third encapsulation layer 630. The second encapsulation layer 620 may include a different material from the first encapsulation layer 610 and the third encapsulation layer 630. For example, the first encapsulation layer 610 and the third encapsulation layer 630 may be inorganic insulating films formed of an inorganic insulating material, and the second encapsulation layer 620 may be an organic insulating film formed of an organic insulating material. The first encapsulation layer 610 of the encapsulation member 600 may be disposed on the second electrode 530. The second encapsulation layer 620 may be disposed on the first encapsulation layer 610. The third encapsulation layer 630 may be disposed on the second encapsulation layer 620.

The first encapsulation layer 610 and the third encapsulation layer 630 of the encapsulation member 600 may be formed of an inorganic material such as silicon nitride (SiNx) or silicon oxide (SiOx). The second encapsulation layer 620 of the encapsulation member 600 may be formed of an organic material such as acrylic resin, epoxy resin, phenolic resin, polyamide resin, or polyimide resin.

The display apparatus according to an exemplary embodiment of the present disclosure may be described as follows.

A display apparatus according to an exemplary embodiment of the present disclosure may include an oxide semiconductor pattern disposed on a device substrate and including a channel region disposed between a source region and a drain region, a gate electrode overlapping the channel region of the oxide semiconductor pattern and having a structure in which a first hydrogen barrier layer and a gate conductive layer are stacked, and a gate insulating film disposed between the oxide semiconductor pattern and the gate electrode to expose the source region and the drain region of the oxide semiconductor pattern. The gate electrode may expose a portion of the gate insulating film that is adjacent to the source region and a portion of the gate insulating film that is adjacent to the drain region.

According to an exemplary embodiment of the present disclosure, the side surface of the gate conductive layer may be vertically aligned with the side surface of the first hydrogen barrier layer.

According to an exemplary embodiment of the present disclosure, the gate insulating film may include stepped portions positioned in the regions exposed by the gate electrode.

According to an exemplary embodiment of the present disclosure, the gate electrode may include a side surface spaced apart from the stepped portions.

According to an exemplary embodiment of the present disclosure, the first hydrogen barrier layer may be disposed between the gate insulating film and the gate conductive layer.

According to an exemplary embodiment of the present disclosure, the first hydrogen barrier layer may be in contact with the gate insulating film.

According to an exemplary embodiment of the present disclosure, the gate electrode may further include a second hydrogen barrier layer. The gate conductive layer may be disposed between the first hydrogen barrier layer and the second hydrogen barrier layer.

According to an exemplary embodiment of the present disclosure, the second hydrogen barrier layer may include a tip region protruding to the outside of the gate conductive layer.

A display apparatus according to an exemplary embodiment of the present disclosure may include an oxide semiconductor pattern disposed on a device substrate and including a source region, a channel region, and a drain region positioned parallel to each other in a first direction, a gate insulating film disposed on the channel region of the oxide semiconductor pattern, and a gate electrode disposed on the gate insulating film and extending in a second direction perpendicular to the first direction. The gate electrode may be structured such that a hydrogen barrier layer and a gate conductive layer are stacked. The length of the gate electrode in the first direction may be shorter than the length of the gate insulating film in the first direction.

According to an exemplary embodiment of the present disclosure, the thickness of the hydrogen barrier layer may be smaller than the thickness of the gate conductive layer.

According to an exemplary embodiment of the present disclosure, the length of the gate electrode in the second direction may be longer than the length of the gate insulating film in the second direction.

According to an exemplary embodiment of the present disclosure, the gate insulating film and the gate electrode may be stacked on a side surface of the oxide semiconductor pattern extending in the first direction.

According to an exemplary embodiment of the present disclosure, the gate conductive layer may have a shorter length than the hydrogen barrier layer in the first direction.

According to an exemplary embodiment of the present disclosure, the gate electrode may expose an edge of the gate insulating film. The gate insulating film may include stepped portions positioned outside the gate electrode. The side surface of the hydrogen barrier layer may be vertically aligned with the sidewall of each of the stepped portions.

A display apparatus according to an exemplary embodiment of the present disclosure may include a first thin-film transistor including a first semiconductor pattern including poly-silicon, a first gate electrode overlapping the first semiconductor pattern, with a first gate insulating film interposed therebetween, and first source and drain electrodes connected to the first semiconductor pattern, and a second thin-film transistor including a second semiconductor pattern including an oxide semiconductor, a second gate electrode overlapping the second semiconductor pattern, with a second gate insulating film interposed therebetween, and second source and drain electrodes connected to the second semiconductor pattern. The second gate electrode may include a gate conductive layer disposed on the second gate insulating film and a hydrogen barrier layer disposed between the gate conductive layer and the second gate insulating film. Opposite side surfaces of the hydrogen barrier layer may be positioned further inwards than opposite side surfaces of the second gate insulating film.

According to an exemplary embodiment of the present disclosure, the gate conductive layer and the hydrogen barrier layer may include different metal materials from each other.

According to an exemplary embodiment of the present disclosure, the thickness of the gate conductive layer may be larger than the thickness of the hydrogen barrier layer.

According to an exemplary embodiment of the present disclosure, the hydrogen barrier layer may include titanium (Ti) or a titanium alloy.

According to an exemplary embodiment of the present disclosure, the top surface of the second gate insulating film may include a protruding portion extending without overlapping the hydrogen barrier layer.

According to an exemplary embodiment of the present disclosure, the protruding portion of the second gate insulating film may have a stepped portion.

According to an exemplary embodiment of the present disclosure, the second gate insulating film may have a first thickness in a region thereof that overlaps the hydrogen barrier layer and a second thickness in a region thereof that does not overlap the hydrogen barrier layer.

According to an exemplary embodiment of the present disclosure, the display apparatus may further include a short circuit prevention pattern disposed on the protruding portion of the second gate insulating film. The short circuit prevention pattern may include a first short circuit prevention pattern disposed so as to be in contact with the left side surface of the hydrogen barrier layer and a second short circuit prevention pattern disposed so as to be in contact with the right side surface of the hydrogen barrier layer.

According to an exemplary embodiment of the present disclosure, the short circuit prevention pattern may include a titanium oxide (TiOx)-based material.

As is apparent from the above description, in a display apparatus according to an exemplary embodiment of the present disclosure, an oxide semiconductor pattern includes a source region and a drain region, which are conductorized in the process of forming a gate insulating film, and a gate electrode disposed on the gate insulating film includes a side surface that is positioned further inwards than the gate insulating film. Accordingly, it is possible to prevent deterioration in the characteristics of a thin-film transistor due to the process of forming the gate insulating film. As a result, the reliability of a driving circuit disposed in each pixel in the display apparatus according to an exemplary embodiment of the present disclosure may be improved.

Although the exemplary embodiments of the present disclosure have been described in detail with reference to the accompanying drawings, the disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical concept of the present disclosure is not limited thereto. Therefore, it should be understood that the above-described exemplary embodiments are illustrative in all aspects and do not limit the present disclosure. The protection scope of the present disclosure should be construed based on the appended claims, and all the technical concepts in the equivalent scope thereof should be construed as falling within the scope of the present disclosure.

What is claimed is:

1. A display apparatus comprising;
a driving circuit in a pixel of a substrate, the driving circuit including a first thin film transistor and a second thin film transistor; and
a light-emitting device in the pixel of the substrate, the light-emitting device electrically connected to the driving circuit,
wherein a first semiconductor pattern of the first thin film transistor includes an oxide semiconductor,
wherein the first semiconductor pattern includes a first channel region between a first source region and a first drain region,
wherein each of the first source region and the first drain region extends from the first channel region in an inclined direction with respect to a lower surface of the first channel region, such that a lower surface of the first source region and a lower surface of the first drain region opposite to the first channel region are disposed closer to the substrate than the lower surface of the first channel region, and
wherein the first thin film transistor includes a first source electrode connected to the first source region and a first drain electrode connected to the first drain region,
wherein each of the first source electrode and the first drain electrode is formed with a plurality of inclined steps.

2. The display apparatus according to claim 1, wherein the first source region has a shape symmetrical to the first drain region, with respect to the first channel region.

3. The display apparatus according to claim 1, wherein a second semiconductor pattern of the second thin film transistor includes a different material from the first semiconductor pattern of the first thin film transistor.

4. The display apparatus according to claim 3, wherein the second semiconductor pattern of the second thin film transistor includes low temperature poly-silicon (LTPS).

5. The display apparatus according to claim 3, wherein the second semiconductor pattern is disposed on a different layer from the first semiconductor pattern.

6. The display apparatus according to claim 5, further comprising a buffer layer on the second semiconductor pattern,
wherein the buffer layer includes silicon nitride (SiNx), and
wherein the first semiconductor pattern is disposed on the buffer layer.

7. The display apparatus according to claim 5, further comprising an interlayer insulating film on the first semiconductor pattern,
wherein the first source electrode and the first drain electrode on the interlayer insulating film, and
wherein the second thin film transistor includes a second source electrode and a second drain electrode on the interlayer insulating film.

8. The display apparatus according to claim 7, wherein the second source electrode and the second drain electrode of the second thin film transistor are disposed on a same layer as the first source electrode and the first drain electrode of the first thin film transistor.

9. The display apparatus according to claim 1, further comprising a conductive pattern between the substrate and the first semiconductor pattern of the first thin film transistor,
wherein the first source region and the first drain region of the first semiconductor pattern are disposed outside the conductive pattern.

10. The display apparatus according to claim 9, wherein the second thin film transistor includes a second gate electrode disposed on a same layer as the conductive pattern.

11. The display apparatus according to claim 9, wherein the conductive pattern overlaps the first channel region.

12. The display apparatus according to claim 11, wherein a distance between the first source region and the first drain region increases as a distance from the lower surface of the first channel region increases.

13. The display apparatus according to claim 1, wherein each of the first source region and the first drain region includes a stepped portion.

14. The display apparatus according to claim 1, wherein the first channel region has a flat shape parallel to the substrate.

* * * * *